US011158389B2

(12) United States Patent
Futatsuyama et al.

(10) Patent No.: US 11,158,389 B2
(45) Date of Patent: Oct. 26, 2021

(54) MEMORY DEVICE

(71) Applicant: TOSHIBA MEMORY CORPORATION, Tokyo (JP)

(72) Inventors: Takuya Futatsuyama, Yokohama Kanagawa (JP); Kenichi Abe, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/194,135

(22) Filed: Mar. 5, 2021

(65) Prior Publication Data

US 2021/0193233 A1 Jun. 24, 2021

Related U.S. Application Data

(63) Continuation of application No. 16/737,467, filed on Jan. 8, 2020, now Pat. No. 10,978,164, which is a
(Continued)

(30) Foreign Application Priority Data

Mar. 15, 2016 (JP) ................................. 2016-051173

(51) Int. Cl.
*G11C 16/26* (2006.01)
*H01L 27/11556* (2017.01)
*H01L 27/11524* (2017.01)
*G11C 16/04* (2006.01)
(Continued)

(52) U.S. Cl.
CPC .......... *G11C 16/26* (2013.01); *G11C 16/0483* (2013.01); *G11C 16/08* (2013.01);
(Continued)

(58) Field of Classification Search
CPC ................ G11C 16/26; G11C 16/0483; H01L 27/11556
See application file for complete search history.

(56) References Cited

U.S. PATENT DOCUMENTS 8,187,936 B2    5/2012  Alsmeier et al.
8,440,528 B2*   5/2013  Kito ..................... H01L 29/7881
                                                         438/267
(Continued)

FOREIGN PATENT DOCUMENTS

JP          2015228484 A     12/2015

OTHER PUBLICATIONS

Japanese Office Action dated Nov. 20, 2018 in related Japanese Patent Application 2016-051173 (with English translation) 7 pages.

*Primary Examiner* — Anthan Tran
(74) *Attorney, Agent, or Firm* — Kim & Stewart LLP

(57) ABSTRACT

A memory device includes a semiconductor column extending above a substrate, a first conductive layer on a first side of the semiconductor column, a second conductive layer on a second side of the semiconductor column, opposite to the first conductive layer, a third conductive layer above or below the first conductive layer and on the first side of the semiconductor column, a fourth conductive layer on the second side of the semiconductor column, opposite to the third conductive layer, and a bit line connected to the semiconductor column. During reading in which a positive voltage is applied to the bit line, first, second, third, and fourth voltages applied to the first, second, third, and fourth conductive layers, respectively, wherein the first voltage and the third voltage are higher than each of the second voltage and the fourth voltage, and the third voltage is higher than the first voltage.

20 Claims, 20 Drawing Sheets

Related U.S. Application Data continuation of application No. 16/428,916, filed on May 31, 2019, now Pat. No. 10,559,364, which is a continuation of application No. 15/280,429, filed on Sep. 29, 2016, now Pat. No. 10,340,013.

(51) Int. Cl.
  *G11C 16/10* (2006.01)
  *G11C 16/08* (2006.01)

(52) U.S. Cl.
  CPC ........ *G11C 16/10* (2013.01); *H01L 27/11524* (2013.01); *H01L 27/11556* (2013.01)

(56) References Cited

U.S. PATENT DOCUMENTS

| | | |
|---|---|---|
| 8,766,351 B2 | 7/2014 | Imamura et al. |
| 8,779,499 B2 | 7/2014 | Kiyotoshi |
| 9,397,110 B2 | 7/2016 | Lue |
| 10,559,364 B2 | 2/2020 | Futatsuyama et al. |
| 2012/0001252 A1 | 1/2012 | Alsmeier et al. |
| 2012/0132981 A1 | 5/2012 | Imamura et al. |
| 2012/0213009 A1 | 8/2012 | Aritome et al. |
| 2012/0243358 A1 | 9/2012 | Sugimae et al. |
| 2012/0267699 A1 | 10/2012 | Kiyotoshi |
| 2013/0087845 A1* | 4/2013 | Yasuda ............ H01L 29/40117 257/324 |
| 2013/0128660 A1 | 5/2013 | Yoo et al. |
| 2013/0248965 A1 | 9/2013 | Nakai et al. |
| 2013/0332659 A1* | 12/2013 | Maejima ................ G11C 16/16 711/103 |
| 2014/0043360 A1* | 2/2014 | Kodama ............ G11C 29/006 345/619 |

* cited by examiner

FIG. 7

|  | Selected block ||| Non-selected block |
|  | Non-selected string NS0 | Selected string NS1 | Non-selected string NS2 | Non-selected string NS3 |  |
| --- | --- | --- | --- | --- | --- |
| BL |  | Vbl ||  |
| SGDL | Vss | Vsg | Vss | Vss | Vss |
| WLDD | Vneg | Vread | Vread | Vneg | Floating |
| WLx+1 | Vneg | Vreadk | Vreadk | Vneg | Floating |
| selected WLx | Vneg | Vcgr | Vcgr | Vneg | Floating |
| WLx-1 | Vneg | Vreadk | Vreadk | Vneg | Floating |
| remaining WLs | Vneg | Vread | Vread | Vneg | Floating |
| WLDS | Vneg | Vread | Vread | Vneg | Floating |
| SGSL | Vss | Vsg | Vsg | Vss | Vss |
| SL |  | Vcelsrc |||  |
| CPWELL |  | Vcelsrc |||  |

FIG. 13

|  | Selected block | | | | Non-selected block |
|---|---|---|---|---|---|
|  | Non-selected string NS0 | Selected string NS1 | Non-selected string NS2 | Non-selected string NS3 | |
| BL |  | Vbl | | | |
| SGDL | Vss | Vsg | Vss | Vss | Vss |
| WLDD | Vneg | Vread | Vreadk | Vneg | Floating |
| WLx+1 | Vm | Vreadk | Vreadk | Vm | Floating |
| selected WLx | Vneg | Vcgr | Vcgr | Vneg | Floating |
| WLx-1 | Vm | Vreadk | Vreadk | Vm | Floating |
| remaining WLs | Vneg | Vread | Vread | Vneg | Floating |
| WLDS | Vneg | Vread | Vread | Vneg | Floating |
| SGSL | Vss | Vsg | Vsg | Vss | Vss |
| SL |  | Vcelsrc | | | |
| CPWELL |  | Vcelsrc | | | |

FIG. 16

| | Selected block | | | | Non-selected block |
|---|---|---|---|---|---|
| | Non-selected string NS0 | Selected string NS1 | Non-selected string NS2 | Non-selected string NS3 | |
| BL | Vbl | | | | |
| SGDL | Vss | Vsg | Vss | Vss | Vss |
| WLDD | Vneg/Vm2 | Vread | Vread | Vneg/Vm2 | Floating |
| WLx+1 | Vm | Vreadk | Vreadk | Vm | Floating |
| selected WLx | Vneg | Vcgr | Vcgr | Vneg | Floating |
| WLx-1 | Vm | Vreadk | Vreadk | Vm | Floating |
| remaining WLs | Vm2 | Vread | Vread | Vm2 | Floating |
| WLDS | Vneg/Vm2 | Vread | Vread | Vneg/Vm2 | Floating |
| SGSL | Vss | Vsg | Vsg | Vss | Vss |
| SL | Vcelsrc | | | | |
| CPWELL | Vcelsrc | | | | |

FIG. 19

| | Selected block | | | | Non-selected block |
|---|---|---|---|---|---|
| | Non-selected string NS0 | Selected string NS1 | Non-selected string NS2 | Non-selected string NS3 | |
| BL | | VSS or VDD | | | Vss |
| SGDL | Vss | Vsgd | Vss | Vss | Floating |
| WLDD | Vgp | Vgp | Vgp | Vgp | Floating |
| selected WLx | Vpass | Vpgm | Vpgm | Vpass | Floating |
| unselected WL | Vpass | Vpass | Vpass | Vpass | Floating |
| WLDS | Vgp | Vgp | Vgp | Vgp | Floating |
| SGSL | Vsgs | Vsgs | Vsgs | Vsgs | Vss |
| SL | | Vdd | | | |
| CPWELL | | Vss | | | |

FIG. 21

| | Selected block | | | | Non-selected block |
|---|---|---|---|---|---|
| | Non-selected string NS0 | Selected string NS1 | Non-selected string NS2 | Non-selected string NS3 | |
| BL | | ≑Vera | | | |
| SGDL | | ≑Vera | ≑Vera | | Floating |
| WLDD | | ≑Vera | ≑Vera | | Floating |
| selected WLx | | | ≑Vera | | Floating |
| unselected WL | | | ≑Vera | | Floating |
| WLDS | | | ≑Vera | | Floating |
| SGSL | | Vera−Verasgs→≑Vera | | | Floating |
| SL | | ≑Vera | | | |
| CPWELL | | Vera | | | |

MEMORY DEVICE

CROSS-REFERENCE TO RELATED APPLICATION

This application is a continuation of U.S. patent application Ser. No. 16/737,467, filed on Jan. 8, 2020, which is a continuation of U.S. patent application Ser. No. 16/428,916, filed on May 31, 2019, now U.S. Pat. No. 10,559,364, issued on Feb. 11, 2020, which is a continuation of U.S. patent application Ser. No. 15/280,429, filed on Sep. 29, 2016, now U.S. Pat. No. 10,340,013, issued on Jul. 2, 2019, which is based upon and claims the benefit of priority from Japanese Patent Application No. 2016-051173, filed Mar. 15, 2016, the entire contents of which are incorporated herein by reference.

FIELD

Embodiments described herein relate generally to a memory device.

BACKGROUND

Generally, a memory device that includes memory cells arranged in three dimensions is known.

DESCRIPTION OF THE DRAWINGS

FIG. 7 is a table illustrating an example of voltages of several wiring lines of the memory device of the first embodiment at a point in time during reading.

FIG. 13 is a table illustrating an example of voltages of several wiring lines of the memory device of the second embodiment at a point in time during reading.

FIG. 16 is a table illustrating a first modification example of voltages of the memory device of the second embodiment applied at a point in time during reading.

FIG. 19 is a table illustrating an example of voltages of several wiring lines of the memory device of the third embodiment at a point in time during writing.

FIG. 21 is a table illustrating an example of voltages of several wiring lines of the memory device of the fourth embodiment at a point in time during reading.

DETAILED DESCRIPTION

Figure 1:
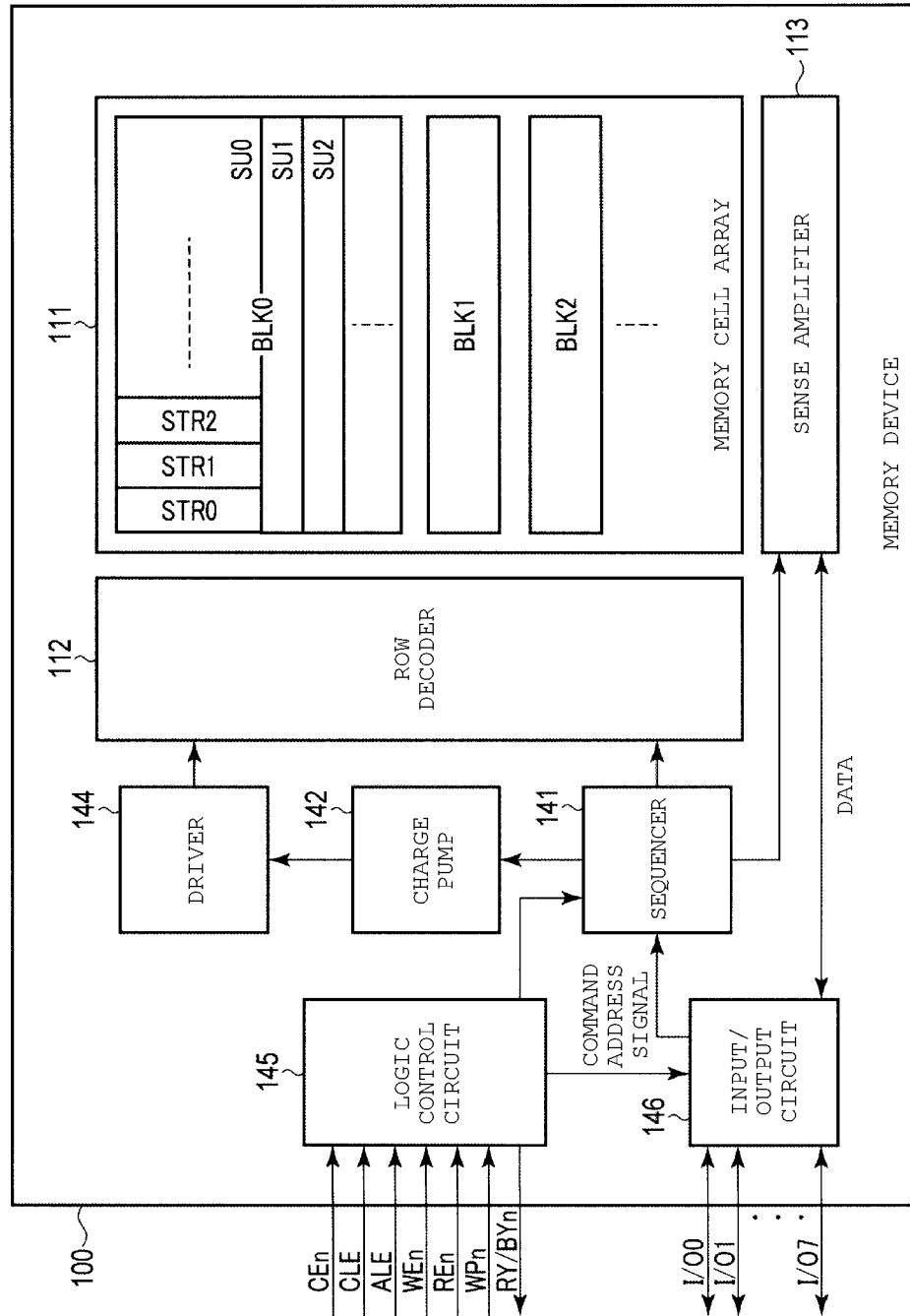
FIG. 1 is a functional block diagram of a memory device of an embodiment.

Embodiments provide a memory device capable of enhancing reliability.

According to an embodiment, a memory device includes a semiconductor column extending above a substrate, a first conductive layer on a first side of the semiconductor column, a second conductive layer on a second side of the semiconductor column, opposite to the first conductive layer, a third conductive layer above or below the first conductive layer and on the first side of the semiconductor column, a fourth conductive layer on the second side of the semiconductor column, opposite to the third conductive layer, and a bit line connected to the semiconductor column. During reading in which a positive voltage is applied to the bit line, a first voltage is applied to the first conductive layer and a second voltage is applied to the second conductive layer, and a third voltage is applied to the third conductive layer and a fourth voltage is applied to the fourth conductive layer, wherein the first voltage and the third voltage are higher than each of the second voltage and the fourth voltage, and the third voltage is higher than the first voltage.

Hereinafter, description will be made on the present embodiment with reference to the accompanying drawings. In the following description, elements having substantially the same functionality and configuration are denoted by the same reference numerals and description thereof will not be repeated. It should be noted that drawings are schematically illustrated and a relationship between a thickness and plane dimension, a ratio of thickness in each layer and the like are different from actual ones. Embodiments herein are described in order to exemplify an apparatus or a method for embodying a technical spirit of the embodiments, and the technical spirit of the embodiments regarding material of components, a shape, a structure, an arrangement, applied voltage, and the like are not limited to those described in the following description.

Configuration and Structure

FIG. 1 is a functional block diagram of a memory device (semiconductor memory device) 100 of a first embodiment. As illustrated in FIG. 1, the memory device 100 includes elements such as a memory cell array 111, a row decoder 112, a sense amplifier 113, a sequencer (controller) 141, a charge pump 142, a driver 144, a logic control circuit 145, and an input/output circuit 146.

The cell array 111 includes a plurality of memory blocks BLK (BLK0, BLK1, . . . ). The block BLK corresponds to, for example, a portion between contacts 45 (see FIG. 3), which will be described later, and for example, is a unit of data erasure, and pieces of data in each block BLK are erased in a batch. Data may be erased in a unit (for example, one half of a block BLK) smaller than a single block BLK.

Each block BLK includes a plurality of string units (chunk) SU (SU0, SU1, . . . ). Each string unit SU includes a plurality of NAND strings NS. The string NS includes a cell transistor MT (not illustrated). The cell array 111 is further provided with wiring lines (not illustrated) such as a word line WL, a bit line BL, a source line SL, and selection gate lines SGDL and SGSL.

The input/output circuit 146 transmits and receives signals I/O 0 to I/O 7 to and from outside of the memory device 100. The signal I/O has, for example, an 8-bit width, is a physical object of data, and includes a command, write data or read data, and an address signal.

The logic control circuit 145 receives various control signals from outside of the memory device 100 and controls the sequencer 141 and the input/output circuit 146 based on the control signals. The control signals include, for example, signals CEn, CLE, ALE, WEn, REn, WPn, and RY/BYn. The "n" added at the end of a signal name means that the signal is asserted in a case where a signal is at a low level.

The signal CEn which is asserted enables the memory device 100. The signals CLE and ALE which are asserted notify the memory device 100 that signals I/O, which flow to the memory device 100 together with the asserted signals CLE and ALE, are a command and an address, respectively. The signal WEn which is asserted instructs the memory device 100 to take in the signal I/O, which flow to the memory device 100 together with the asserted signal WEn. The signal REn which is asserted instructs the memory device 100 to output the signal I/O. The signal WPn which is asserted gives an instruction prohibiting a data write and a data erasure to the memory device 100. The signal RY/BYn indicates whether the memory device 100 is in a ready state (a state being ready to receive instruction from outside of the memory device 100), in a busy state (a state of not being ready to receive instruction from outside of the memory device 100), and the busy state is indicated by the low level.

The sequencer 141 controls the charge pump 142, the row decoder 112, and the sense amplifier 113 based on the command signal and the address signal.

The charge pump 142 receives a power supply voltage (potential) from outside of the memory device 100 and generates various voltages (potential) from the power supply voltage. The generated voltage is supplied to the driver 144 or the like. The voltage generated by the charge pump 142 includes, for example, voltages to be applied to the word line WL, the selection gate lines SGDL and SGSL, and the source line SL. The driver 144 receives voltages generated by the charge pump 142 and supplies a voltage selected from the received voltages to the row decoder 112 according to the control of the sequencer 141. The row decoder 112 receives various voltages from the driver 144, selects a single block BLK based on the address signal from outside of the memory device 100, and transfers the voltage from the driver 144 to the selected block BLK. The sense amplifier 113 senses data read from the cell transistor MT and transfers write data from outside of the memory device 100 to the cell transistor MT.

Figure 2:
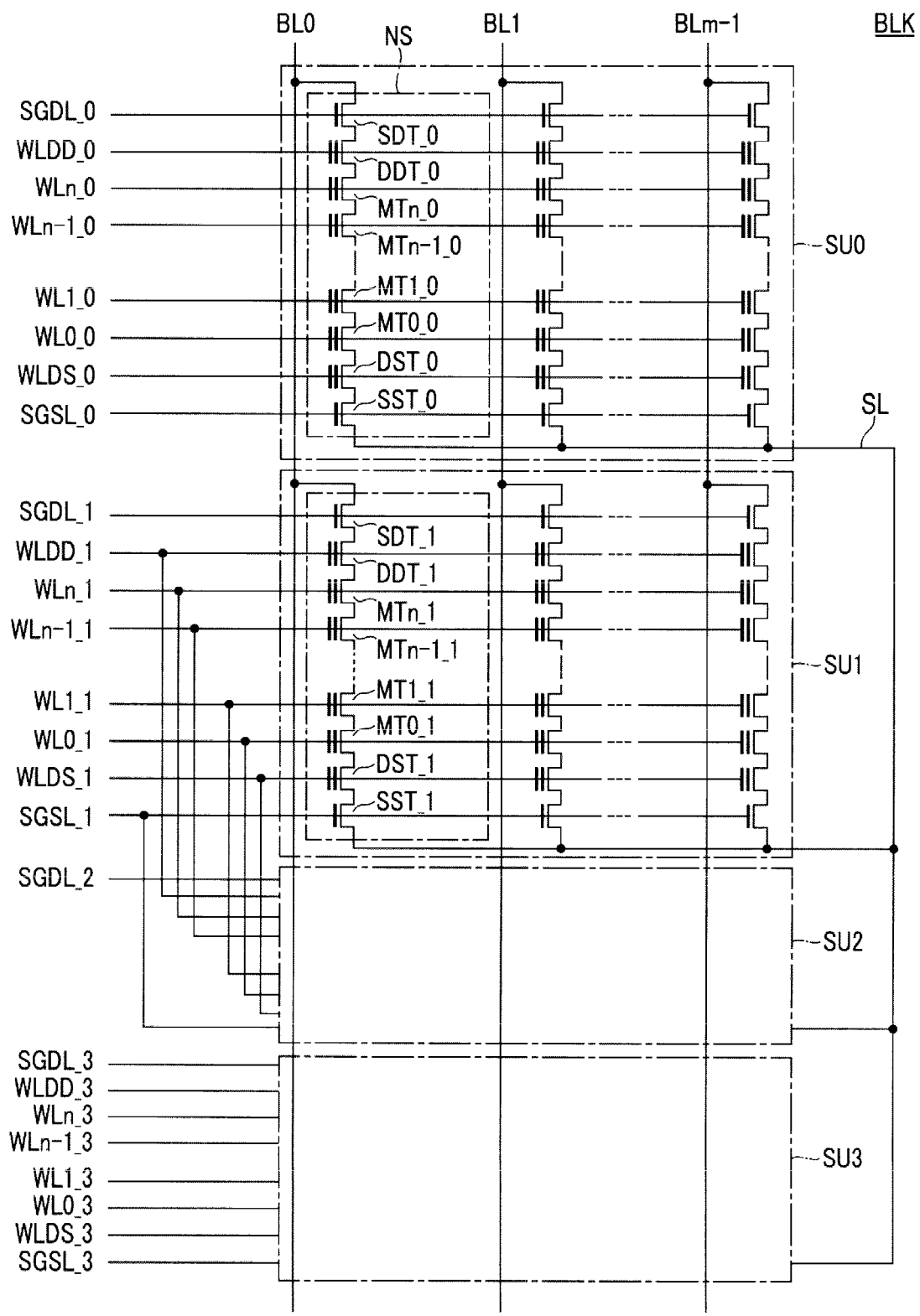
FIG. 2 is a diagram illustrating an example of a memory block of a memory device of a first embodiment.

The block BLK includes, for example, elements and connections illustrated in FIG. 2. As illustrated in FIG. 2, the block BLK includes, for example, four string units SU. Each string unit SU includes a plurality of strings NS as described above and is, for example, a set of the plurality of strings NS. In a case where an underscore and a number following the underscore are added at the end of a name of an element, the number following the underscore distinguishes among the same elements.

Each string NS is connected between the source line SL and a single bit line BL. Each string NS includes cell transistors MT (MT0 to MTn), dummy transistors DST and DDT, and selection gate transistors SST and SDT. The "n" is a natural number. Each string NS may include a single dummy transistor or a plurality of dummy transistors between one of the selection gate transistors SST and SDT and the cell transistors MT. Each string NS may include the plurality of dummy transistors DST connected in series and (or) the plurality of dummy transistors DDT connected in series. The transistors SST, DST, MT0 to MTn, DDT, and SDT are connected in series in this order. Each cell transistor MT may be stored in a nonvolatile manner according to the quantity of charges contained in the layer.

A control gate electrode of each cell transistor MTp (p is 0 or a natural number of n or less) of each string NS of each string unit SU is connected to a word line WLp. Each word line WL is able to be controlled independently by the row decoder 112. Each dummy transistor DST of each string NS of each string unit SU is connected to a word line WLDS (dummy word line). Each dummy transistor DDT of each string NS of each string unit SU is connected to a word line WLDD (dummy word line). A gate of each selection gate transistor SDT of each string NS of each string unit SU is connected to the selection gate line SGDL. A gate of each selection gate transistor SST of each string NS of each string unit SU is connected to the selection gate line SGSL. Furthermore, two string units SU, SU1 and SU2, which are adjacent to each other, share the same word line WLs and the selection gate line SGSL.

In other embodiments, string units SU1 and SU2 may or may not share the selection gate line SGSL.

Each bit line BL is connected to the sense amplifier 113 (not illustrated).

Figure 3:
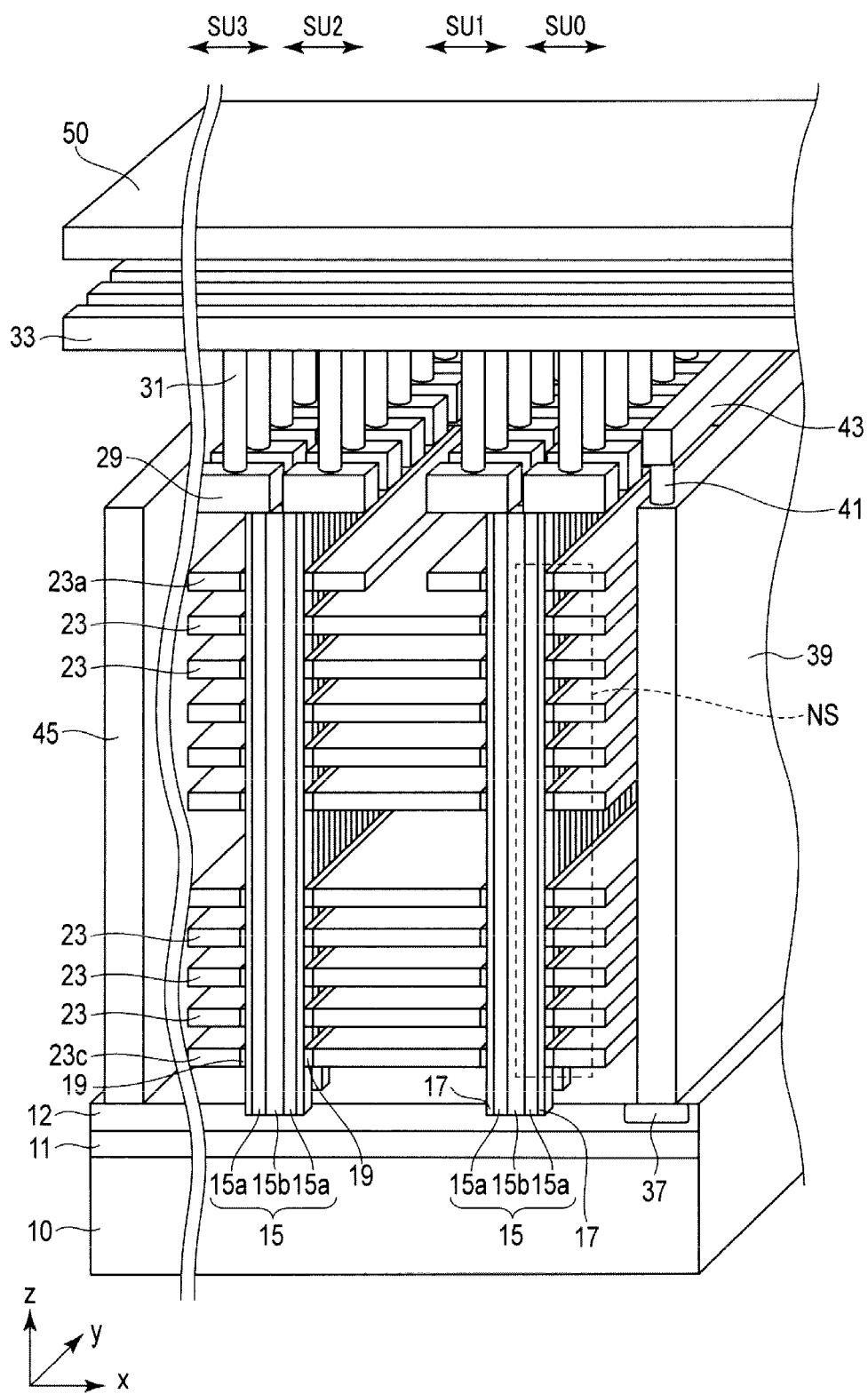
FIG. 3 is a diagram schematically illustrating an example of a structure of a portion of a block of the first embodiment.
Figure 4:
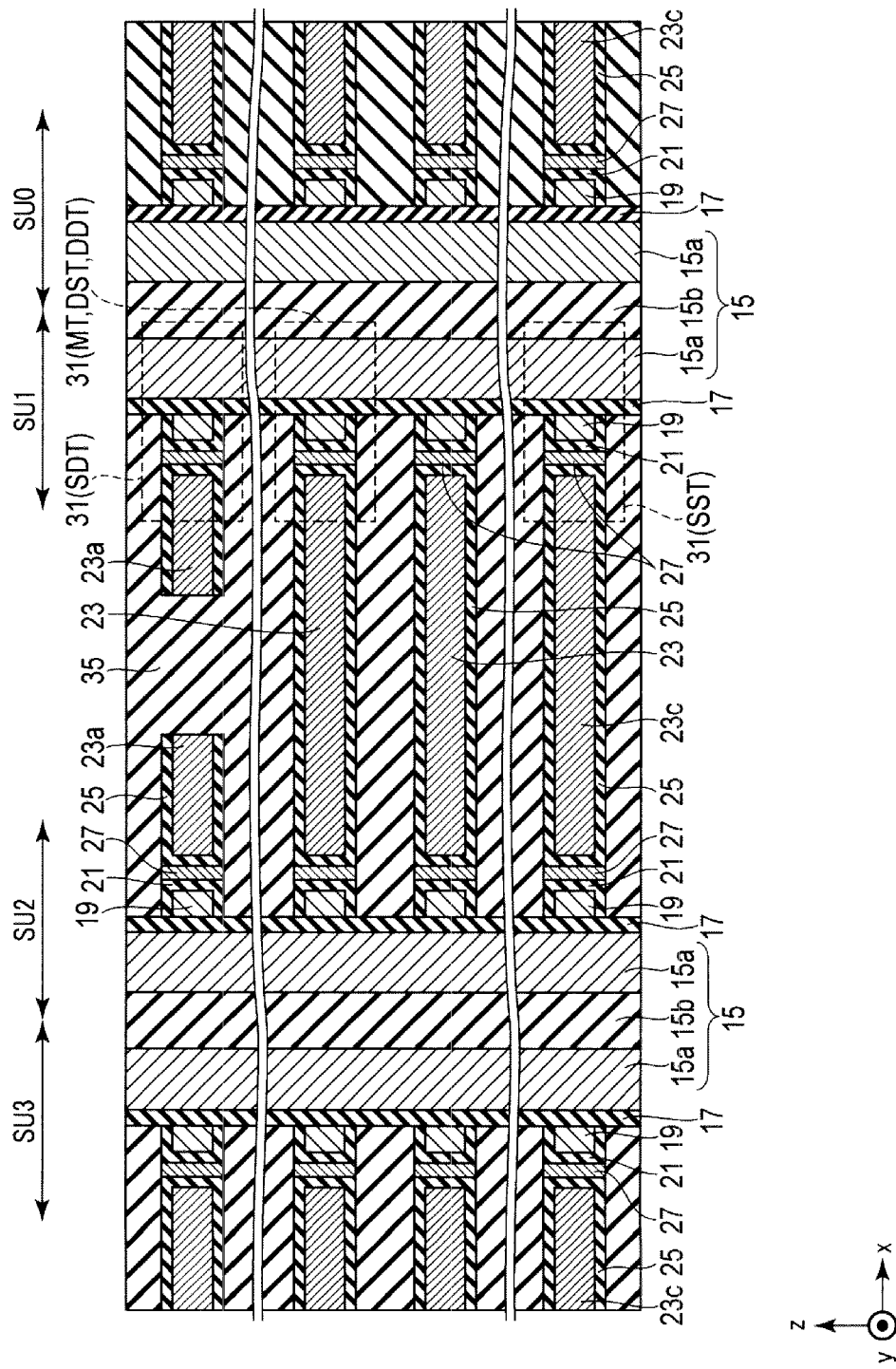
FIG. 4 is a diagram illustrating an example of details of a cross section along the xz plane of the structure of FIG. 3.

The block BLK has a structure illustrated in FIG. 3, for example. FIG. 3 schematically illustrates an example of a structure of a portion of a block of the first embodiment. FIG. 4 is a diagram illustrating an example of details a cross section along the xz plane of the structure of FIG. 3. In particular, FIG. 3 and FIG. 4 represent a portion related to four string units SU0 to SU3 within a single block BLK.

As illustrated in FIG. 3, the string units SU0 to SU3 are provided on the semiconductor substrate 10. The string units SU0 to SU3 are aligned along the x-axis. Each string unit SU includes the plurality of strings NS aligned along the y-axis. Each string NS is connected to a p-type well (CP well) 12 in the lower end and connected to one of the plurality of conductive lines 33 through the conductive line 29 and vias (via plugs) 31 in the upper end. The CP well 12 is provided in an n-type well 11 and the well 11 is provided in a region on a surface of the substrate 10. The well 11 and the CP well 12 extend along the xy plane. The conductive lines 33 function as a bit line BL, extend along the x-axis, and are aligned along the y-axis.

The string NS includes a portion of a pillar (column) 15 containing semiconductor materials. The transistors SST, DST, MT, DDT, and SDT are provided along the pillar 15.

The pillar 15 is provided on the CP well 12. The pillar extends along the z-axis, is arranged in a matrix configuration along the xy plane, and includes a first portion 15a. The first portion 15a contains semiconductor materials, for example, silicon and is not doped with impurities. The first portion 15a functions as a side surface of the pillar 15 and has, for example, a cylindrical shape, and is in contact with CP well 12 at the lower end. The pillar 15 includes a second portion 15b. The second portion 15b corresponds to a portion where the first portion 15a is not provided, that is, the inside portion of a cylinder in a case where the first portion 15a has a cylindrical shape. The second portion 15b is a cavity, includes an insulator, or includes both the cavity and the insulator. One side in the x-axis direction of each pillar 15 functions as a current path for the transistors SST, DST, MT, DDT, and SDT included in a single string NS. The other side in the x-axis direction of each pillar 15 functions as a current path for the transistors SST, DST, MT, DDT, and SDT included in another string NS.

A tunnel insulating film 17 is provided on side surfaces of each pillar 15. The tunnel insulating film 17 covers, for example, the side surfaces of the pillar 15. The tunnel insulating film 17 contains, for example, silicon oxide.

A plurality of films 19 are provided on a surface of the tunnel insulating film 17 along the z-axis. The films 19 have a length along the z-axis (that is, a thickness), are aligned along the z-axis at intervals, have, for example, conductivity, function as a floating gate electrode, and are referred to as a floating gate electrode film 19 in the following. The floating gate electrode film 19 consists of insulating materials in one embodiment. A surface except for a portion of the surface, which is in contact with the tunnel insulating film 17 of the floating gate electrode film 19, is covered with the insulating film 21. The insulating film 21 contains, for example, silicon nitride.

A plurality of the conductive films 23 are provided to be opposed to a plurality of floating gate electrode films 19 in a one-to-one relationship. The conductive film 23 functions as a control gate electrode (word line WL, dummy word lines WLDD and WLDS, and selection gate lines SGDL and SGSL), and is referred to as a control gate electrode film 23 in the following. The control gate electrode film 23 has a length along the z-axis (that is, a thickness), is aligned along the z-axis at intervals, is provided, for example, at a position having a height (a position on the z-axis) which is equal to that of the floating gate electrode film 19, and extends along the y-axis. Each control gate electrode film 23 faces all of strings NS of a single string unit SU. More specifically, each control gate electrode film 23 faces the pillar 15 for each of all of strings NS of a single string unit SU in one side.

Two edges of each control gate electrode film 23 that is between the two pillars 15 aligned and adjacent in the x-direction, are opposed respectively to two floating gate electrode films 19 in contact with the two pillars 15. The uppermost control gate electrode film 23 (23a) with regard to the z-axis does not face both of the two pillars 15 aligned and adjacent in the x-direction but faces only a single pillar 15.

Figure 6:
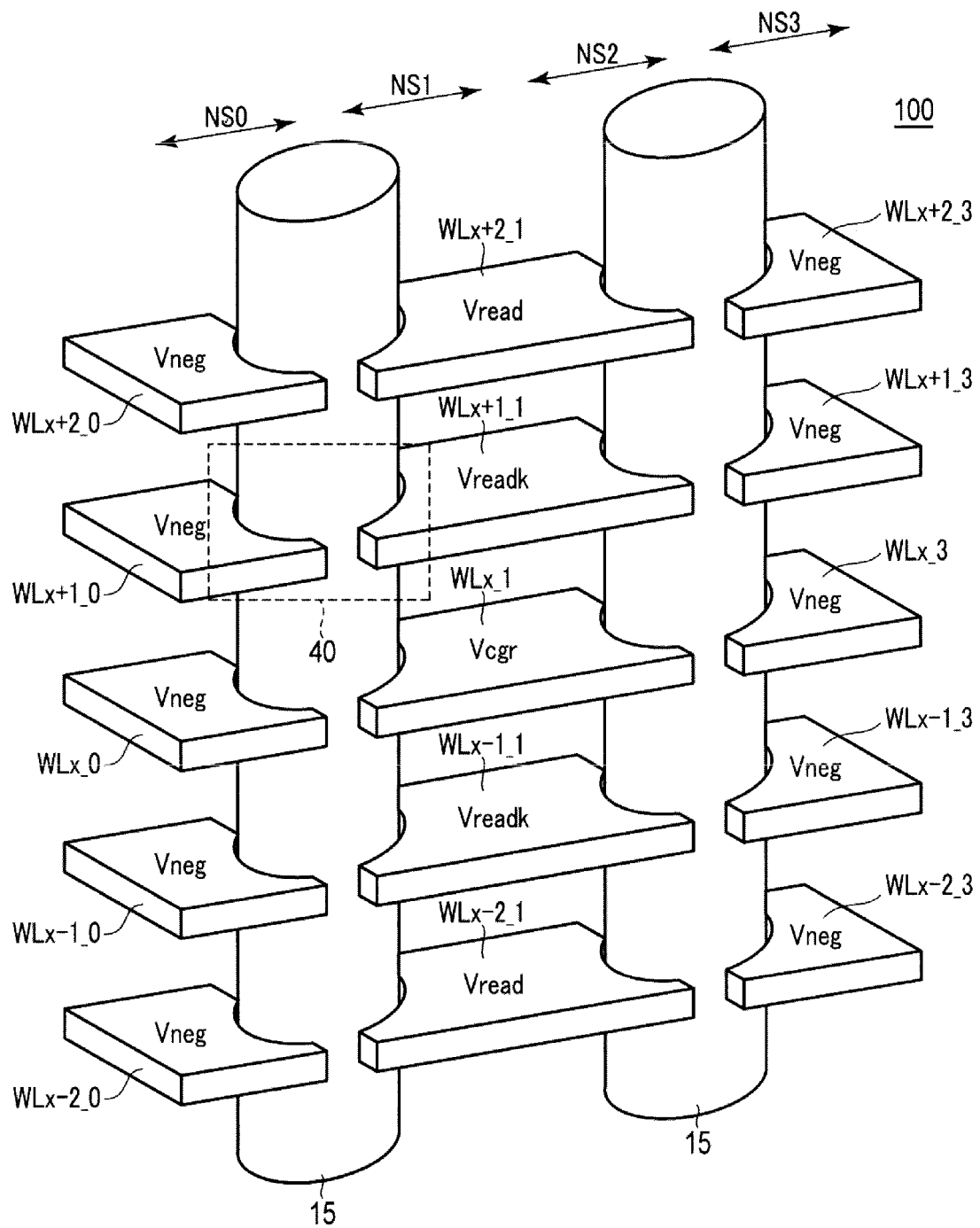
FIG. 6 is a schematic diagram illustrating an example of voltages of several wiring lines of the memory device of the first embodiment at a point in time during reading.

The control gate electrode film 23 (word line WL, dummy word lines WLDD and WLDS, and selection gate lines SGDL and SGSL), has an end facing the pillar 15 with a shape of, for example, a semi-circular shape in cross section, in the xy plane as illustrated in FIG. 6. Although not illustrated, for example, the floating gate electrode film 19 also has a similar shape along an end of the word line WL in the xy plane, and surrounds about half of the pillar 15.

Referring back to FIG. 3 and FIG. 4, a surface, which faces at least the floating gate electrode film 19, of each control gate electrode film 23, is covered with an insulating film 25. The insulating film 25 contains, for example, silicon nitride, and covers, for example, the control gate electrode film 23.

An insulating film 27 is provided between the insulating film 25 and the insulating film 21. The insulating film 27 contains, for example, silicon oxide.

A set of elements in the region 31 functions as a stacked gate type transistor. The transistor (hereinafter, referred to as a transistor 31) of the region 31 includes the single floating gate electrode film 19, a portion aligned with the floating gate electrode film 19 of the first portion 15a of the pillar 15, a portion aligned with the floating gate electrode film 19 of the tunnel insulating film 17, the control gate electrode film 23 facing the floating gate electrode film 19, and the insulating films 21, 25, and 27 between the floating gate electrode film 19 and the control gate electrode film 23. The gate of the transistor 31 is the control gate electrode film 23, a channel region (a region forming a channel of the transistor 31) is a portion of the first portion 15a of the pillar 15 facing the gate electrode film 23, the source region and the drain region are both portions adjacent to the channel region of the first portion 15a of the pillar 15.

The nearest transistor to the substrate 10 functions as a selection gate transistor SST and the farthest transistor from the substrate 10 functions as selection gate transistor SDT, among the transistors 31 using the same pillar 15. The conductive film 23c of the selection gate transistor SST functions as the selection gate line SGSL. The conductive film 23a of the selection gate transistor SDT functions as the selection gate line SGDL, and may be referred to as the selection gate electrode film 23a or 23c.

The transistor 31 adjacent to the selection gate transistor SST along the z-axis functions as the dummy transistor DST, among the plurality of transistors 31 using the same the pillar 15. The transistor 31 adjacent to the selection gate transistor SDT along the z-axis functions as the dummy transistor DDT, among the plurality of transistors 31 using the same the pillar 15.

The transistors other than the dummy transistors DST and DDT, and the selection gate transistors SST and SDT each function as the cell transistor MT, among the plurality of transistors 31 using the same the pillar 15. The cell transistor MT, as a result of writing, contains electrons injected through the tunnel insulating film 17 in the floating gate electrode film 19 and stores data corresponding to the number of electrons. The cell transistor MT which is not holding data, that is, the cell transistor MT which is in a state where data are erased (erasure state), has a threshold voltage smaller than the threshold voltage of the cell transistor MT which is in a state where data are written.

The transistors SST, DST, MT, DDT, and SDT that use the same pillar 15 and are aligned on the same side of the pillar 15 are connected in series with each other through the first portion 15a of the pillar 15. The transistors SST, DST, MT, DDT, and SDT connected in series with each other through the first portion 15a of the pillar 15 function as a single string NS.

As described above, two strings NS aligned in the x-axis direction in the string units SU1 and SU2 share the control gate electrode film 23. For that reason, the control gate electrode films 23 (except for the control gate electrode film 23a) of two strings NS aligned in the x-axis direction are connected with each other in the string units SU1 and SU2.

A diffusion layer 37 doped with n-type impurities is provided in the surface of the CP well 12 at a side of the pillar 15 for the string units SU0 and SU1 and opposite to the pillar 15 for the string units SU2 and SU3. The diffusion layer 37 is connected to the lower end of the contact 39. The contact 39 is connected to the conductive film 43 in the upper end through the contact 41. The conductive film 43 functions as the source line SL. The conductive film 43 is also connected to the conductive film 50 by a contact (not illustrated). The conductive film 50 is located above the conductive film 33 and extends, for example, along the xy plane, and functions as the source line SL.

A region between the control gate electrode films 23 is provided with the insulating film 35.

The contact 45 is provided at a location spaced from the string unit SU3 at a side of the string unit SU3, which is opposite to the string unit SU2. The contact 45 extends along the xy plane.

(Operation)

Figure 5:
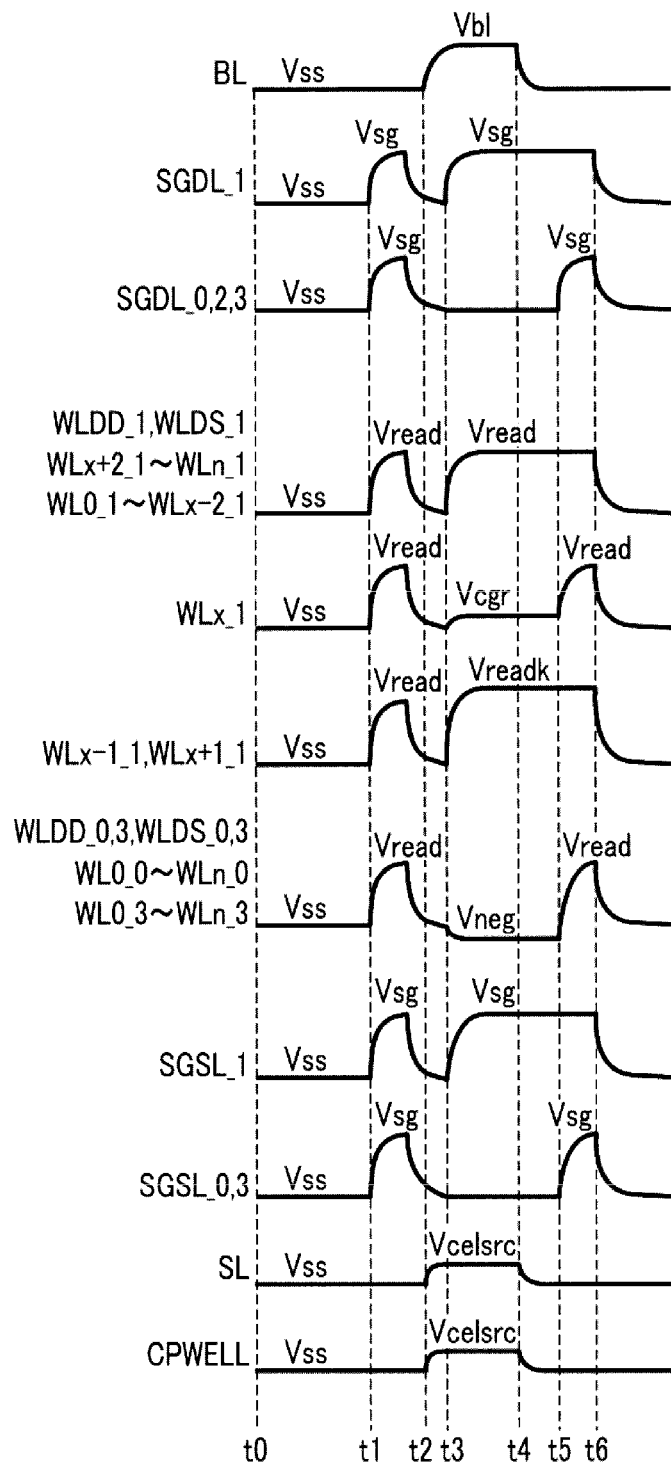
FIG. 5 is a timing diagram of voltages of several wiring lines of a selected block of the memory device of the first embodiment during reading.

FIG. 5 is a timing diagram of voltages (potentials) of several wiring lines of a selected block of the memory device of the first embodiment during reading. In one string unit SU, the word line WL and the selection gate lines SGSL and SGDL, and a voltage are shared among the strings NS included therein. For that reason, in the following, description will be made using a single string NS of each string unit SU as representative.

In the memory device 100 having the structure illustrated in FIG. 3 and FIG. 4, four different states of voltage applications occur in the string NS by selecting string NS and the word line WL. Four states of the string NS during a period between time t3 and time t4, which will be described later, are illustrated in FIG. 6. FIG. 6 illustrates two pillars 15 that share a single bit line BL and a portion of elements related to the pillars 15. Description for an element 40 illustrated in FIG. 6 will be made in a second embodiment.

The string NS1, which is in a first state, of four states of the strings NS, is a selected string, and belong to a string unit SU1, for example. Second to fourth states occur in non-selected strings NS. The string NS0 which is in the second state shares the pillar 15 with the selected string NS1. The string NS2 which is in the third state shares the word line WL with the selected string NS1. The string NS3 which is in the fourth state does not share the pillar 15 and does not share the word line WL with the selected string NS1, and belongs to the string unit SU3, for example. In the non-selected string NS2 which shares the word line WL and the selection gate line SGSL with the selected string NS1, the wiring line to be shared is biased with a voltage which is the same as that of the selected string NS1.

As illustrated in FIG. 5, at a time point time t0, all of word lines WL, all of selection gate lines SGSL and SGDL, the bit line BL, the source line SL, and the CP well 12 in any of the strings NS are controlled to have a ground potential Vss (=0 V) by the control of the sequencer 141.

The sequencer 141 applies a voltage Vsg to the selection gate lines SGDL (SGDL_0 to SGDL_3) and SGSL (SGSL_0, SGSL_1, and SGSL_3) of all of the strings NS temporarily from time t1. The voltage Vsg has a voltage magnitude which is large enough to turn on the selection gate transistors SDT and SST.

The sequencer 141 applies a voltage Vread to all of the word lines WL temporarily from time t1. The voltage Vread has the voltage magnitude which is large enough to turn on any of the cell transistor MT regardless of its threshold voltage. The voltage application at time t1 is performed to reset the pillar 15, that is, to dispel charges that exist unintentionally in the pillar 15 from the pillar 15. However, the voltage application at time t1 is optional in the embodiments.

The sequencer 141 maintains the voltage of the bit line BL at the voltage Vb1 from time t2 and maintains the voltage of the source line SL and the CP well 12 at the voltage Vcelsrc. The voltage Vb1 and the voltage Vcelsrc are each higher than the voltage Vss and the voltage Vcelsrc is lower than the voltage Vb1. The application of the voltage Vb1 and the voltage Vcelsrc continues until time t4. Alternatively, the sequencer 141 may control the voltage of the bit line BL to be set to Vcelsrc from time t2 and to Vb1 from time t3, similar to those illustrated in FIG. 11 which will be described later.

From time t3, the sequencer 141 applies the voltage Vsg to the selection gate line SGDL_1 and SGSL_1 of the selected string NS1. The voltage Vsg is applied to thereby turn on the selection gate transistors SDT 1 and SST 1. The application of the voltage Vsg continues until time t5.

On the other hand, the sequencer 141 continues to apply the voltage Vss to the selection gate lines SGDL_0, SGDL_2, SGDL_3, SGSL_0, and SGSL_3 of the non-selected strings NS0, NS2, and NS3 from time t3 to time t5. For that reason, the selection gate transistors SDT_0, SDT_2, SDT_3, SST_0, SST_2, and SST 3 are maintained in an off state in the non-selected strings NS0, NS2, and NS3.

The sequencer 141 applies the following voltages to the word lines WL0_1 to WLn_1, WLDS_0, and WLDD_0 of the selected string NS1 from time t3 to time t5.

First, the sequencer 141 applies the voltage Vcgr to the word line WLx_1, where "x" is 0 or a natural number of n or less. The word line WLx_1 is connected to the cell transistor MT that is selected for reading (referred to as "selected cell transistor") and is referred to as a selected word line in the following. The voltage Vcgr has a variable value based on the read data. The voltage Vcgr is applied such that the selected cell transistor MT having a threshold voltage, of which magnitude is greater than or equal to the voltage Vcgr, maintains an off state, and the selected cell transistor MT having a threshold voltage, of which magnitude is less than the voltage Vcgr, is turned on.

On the other hand, the sequencer 141 applies the voltage Vread to the word lines WL0_1 to WLx−2_1, WLx+2_1 to WLn_1, WLDS_1, and WLDD_1 and applies the voltage Vreadk to the word lines WLx−1_1 and WLx+1_1. The voltage Vreadk is higher than the voltage Vread. Alternatively, the voltage Vreadk may be equal to the voltage Vread.

The sequencer 141 applies the voltage Vneg to the word lines WL0_0 to WLn_0, WLDS_0, and WLDD_0 of the non-selected string NS0 and the word lines WL0_3 to WLn_3, WLDS_3, and WLDD_3 of the non-selected string NS3 from time t3. The voltage Vneg is smaller than a threshold voltage of any of cell transistors MT that are in the erasure state, of the memory device 100. The voltage Vneg has a negative voltage value.

The voltage is applied at time t3 to thereby allow data maintained in the selected cell transistor MT to be read into the sense amplifier 113. After data is read into the sense amplifier 113, the sequencer 141 applies a voltage to reset the pillar 15 from time t5 to time t6. That is, the sequencer 141 applies the voltage Vsg to the selection gate lines SGDL_0, SGDL_2, SGDL_3, SGSL_0, and SGSL_3 of the non-selected strings NS0, NS2, and NS3, and applies the voltage Vread to the word lines WLx_1, WLDD_0, WLDD_3, WLDS_0, WLDD_3, WL0_0 to WLn_0, and WL0_3 to WLn_3. Resetting from time t5 to time t6 is, however, optional. Reading is ended at time t6.

The voltages applied to several wiring lines between time t3 and time t4 are illustrated in FIG. 7 in a table format.

Reading is also performed during write (program) verification and during erase verification. The write verification is performed after application of a write voltage and indicates confirmation as to whether data is correctly written. The erase verification is performed after application of an erase voltage and indicates confirmation as to whether data is correctly erased. The voltage Vneg in a case of reading during the erase verification has a value lower than the voltage Vneg in a case of a normal reading and the write verification. Regarding other points, the reading during the erase verification and reading during the write verification are the same as normal reading.

Thus, an example in which the string NS1 is selected is described. A case where string NS0, NS2, or NS3 is selected is similar to the example described above. That is, the case where string NS0, NS2, or NS3 is selected is similar to the example in which the string NS1 is selected, except that the selection gate transistor SDT of the selected string NS is turned on and the selection gate transistors SDT of the remaining non-selected strings NS are turned off. In a case where the string NS0 is selected, the strings NS1, NS2, and NS3 are non-selected strings. In a case where the string NS2 is selected, the strings NS0, NS1, and NS3 are non-selected strings. In a case where the string NS3 is selected, the strings NS0, NS1, and NS2 are non-selected strings.

Advantages (Effects)

Each pillar 15 faces two independent control gate electrode films 23 (word lines WL, WLDS, and WLDD) along different heights of the pillar 15. Transistors are formed in portions of the pillar 15 which face two of the respective word lines WL, WLDS, and WLDD, at each of the different heights. The transistors are able to function as the transistor MT and the transistors DST and DDT. The plurality of transistors MT, DST, and DDT, which are positioned at different heights and aligned on one side of the pillar 15, are electrically connected through portions of the pillar 15 in which the transistors MT, DST, and DDT of the pillar 15 are aligned. Additionally, each pillar 15 faces two independent control gate electrode films 23a (selection gate line SGDL). With the structure described above, two independent strings NS are provided in each pillar 15. The two pillars 15 adjacent to each other share the control gate electrode films 23 that are between them. The structure in which two independent strings NS are provided by a single pillar 15 described above is referred to as a shared pillar structure.

Figure 8:
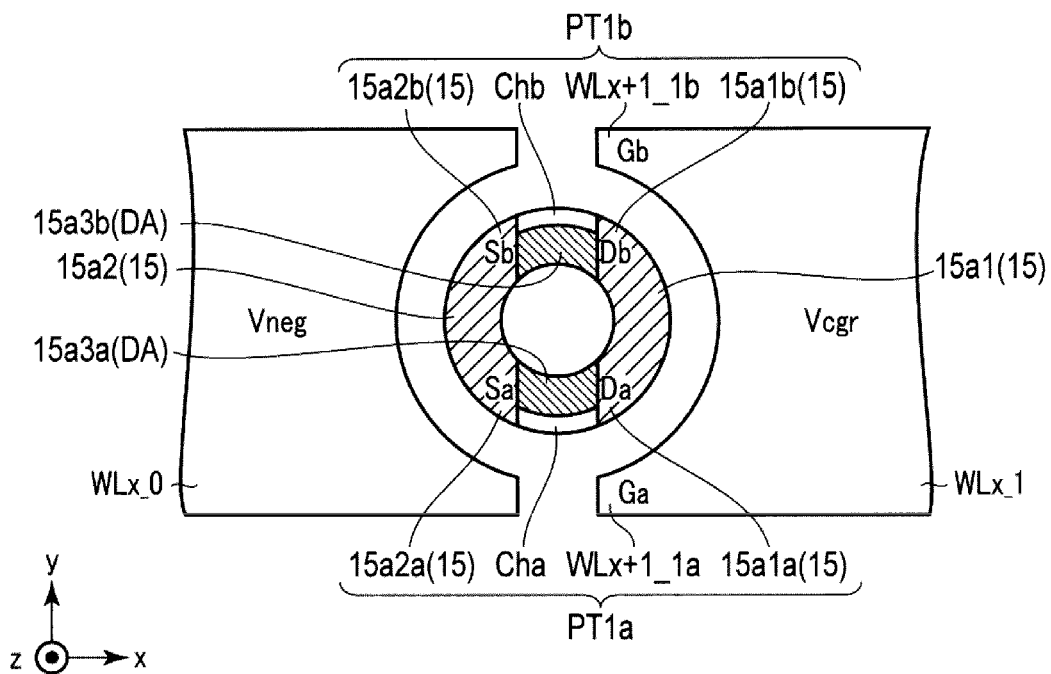
FIG. 8 is a diagram illustrating a state of a certain region of the memory device of the first embodiment during reading.

In the shared pillar structure, it is preferable that respective current paths of two strings NS that share a single pillar 15 are electrically separated from each other. That is, as illustrated in FIG. 8, a region 15a1 facing the word line WLx_1 and a region 15a2 facing the word line WLx_0 of the first portion 15a of the pillar 15 need to be electrically separated from each other. FIG. 8 illustrates a state in a boundary of the word lines WLx_0, WLX_1 of the strings NS0 and NS1 along the xy plane during reading of the memory device of the first embodiment.

During reading, the voltage Vcgr is applied to the selected word line WLx_1 in the selected string NS1. For that reason, it is considered that a positive voltage lower than the voltage Vcgr or the voltage Vss is applied to the word line WLx_0 of the non-selected string NS0 and thus, a depletion layer DA is formed in a region 15a3 between the region 15a1 and 15a2, and the regions 15a1 and 15a2 are electrically separated from each other by the depletion layer DA. That is, the region 15a1 attains a voltage of which the value is close to the voltage Vcgr and the region 15a2 attains a voltage of which the value is close to a positive voltage or which is approximately the voltage Vss. As a result, the depletion layer DA is formed in the region 15a3 by a potential difference between the regions 15a1 and 15a2.

However, the regions 15a1 and 15a2 may be electrically connected through the regions 15a3a and 15a3b by a parasitic transistor which is turned on by the voltage application to the word lines WLx_0 and WLx_1. That is, a parasitic transistor PT1a, in which the portions facing at the lower side of the region 15a1 and 15a2 respectively operate as a drain (Da) and a source (Sa), a portion facing the region 15a3a of the word line WLx_1 operates as a gate Ga, a portion, which is close to the word line WLx_1, of the region 15a3a operates as the channel region Cha, is formed. Similarly, a parasitic transistor PT1b, in which the portions facing at the upper side of the region 15a1 and 15a2 respectively operate as a drain (Db) and a source (Sb), a portion, which faces the region 15a3b of the word line WLx_1, operates as a gate Gb, and a portion, which is close to the word line WLx_1, of the region 15a3b operates as the channel region Chb, is formed. A channel may be formed in the channel regions Cha and Chb by the application of the voltage Vcgr to the word line WLx_1, and the regions 15a1 and 15a2, which are respectively for the strings NS1 and NS0, may be electrically connected with each other. The selected word line WLx_1 needs to receive the voltage Vcgr during reading and thus, the parasitic transistors PT1a and PT1b may be easily turned on due to the effects of the selected word line WLx_1.

Figure 9:
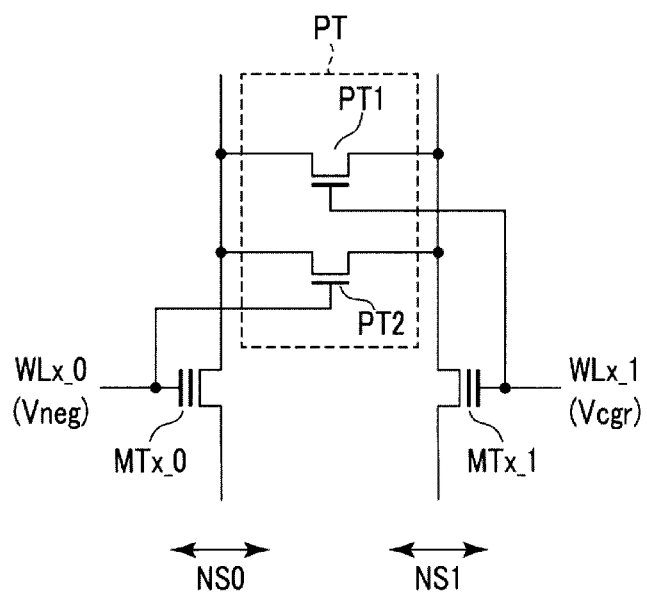
FIG. 9 is a diagram illustrating an equivalent circuit of a portion of the memory device of the first embodiment.

Therefore, a pair of the parasitic transistors PT may be formed between the strings NS0 and NS1 as illustrated in FIG. 9. FIG. 9 illustrates an equivalent circuit of a portion of the memory device of the first embodiment and also an equivalent circuit of the portion of FIG. 8. The parasitic transistors PT1a and PT1b of FIG. 8 are drawn as a single transistor PT1 in FIG. 9. A parasitic transistor PT2, which may be turned on during application of a positive voltage to the word line WLx_0, is also formed between the strings NS0 and NS1.

When the parasitic transistor PT1 and/or parasitic transistor PT2 is turned on, the strings NS1 and NS0 are connected to each other.

Furthermore, in a case where the positive voltage or the voltage Vss is applied to the word line WLx_0 of the non-selected string NS0 and thus the threshold voltage is equal to or less than 0 V in a state where the cell transistor MTx_0 is in the erasure state, the cell transistor MTx_0 may be turned on. As a result, regardless of the threshold voltage of the selected cell transistor MTx_1, the current flows in the cell transistor MTx_0 of the non-selected string NS0 but not in the selected cell transistor MTx_1. This means that a current that does not correctly reflect the state of the selected cell transistor MTx_1 flows. In particular, in a case where the selected cell transistor MTx_1 has the threshold voltage higher than the voltage Vcgr (that is, an off state is maintained by the application of the voltage Vcgr), a correct data read of the selected cell transistor MTx_0 is inhibited.

According to the first embodiment, the voltage Vneg is applied to the word line WLx_0 facing the selected word line WLx_1. The voltage Vneg has a negative voltage value. For that reason, it is difficult to turn on the parasitic transistor PT2. For that reason, the connection of the strings NS0 and NS1 through the parasitic transistor PT2 is suppressed during reading. Furthermore, the voltage Vneg is selected to be smaller than a threshold voltage of any cell transistor MT, which is in an erase state, of the memory device 100. Accordingly, the cell transistor MTx_0 of the non-selected string NS0 is reliably turned off even when it is in the erase state. For that reason, even if the strings NS0 and NS1 are electrically connected to each other by the parasitic transistor PT being in an on state, formation of a current path through the cell transistor MTx_0 by bypassing the selected cell transistor MTx_1 is suppressed. This prevents an occurrence of a situation in which the selected cell transistor MTx_1 in the off state is erroneously determined to be in an on state by the current flowing in the cell transistor MTx_0 of the non-selected string NS0.

According to the first embodiment, voltages indicated in the following are applied to the control gate electrode films 23 and 23a during reading, in the memory device 100 having the shared pillar structure. That is, the voltage Vsg is applied to the selection gate lines SGDL and SGSL in the selected string NS1 and thus, a structure in which the transistors MT, DST, and DDT are connected in series (in the following, may be referred to as a serially connected transistors) is electrically connected to the source line SL and the bit line BL. Additionally, in the selected string NS1, the voltage Vcgr is applied to the selected word line WLx and the voltage Vread or the voltage Vreadk is applied to the remaining non-selected word line WL (WL0 to WLx−1 and WLx+1 to WLn) and the word lines WLDS and WLDD. For that reason, data are able to be read from the selected cell transistor MT_x in the selected string NS1.

The non-selected string NS2 shares the word lines WL, WLDS, and WLDD with the selected string NS1 and thus, a state where data are able to be read from the selected cell transistor MTx is formed also in the non-selected string NS2. However, the voltage Vss is applied to the selection gate line SGDL in the non-selected string NS2 and thus, the serially connected transistor is not connected to the bit line BL in the non-selected string NS2. Accordingly, data of the selected cell transistor MTx of the selected string NS1 and data of the selected cell transistor MTx of the selected string NS2 are not read into a common bit line BL.

The potential Vss is applied to both the selection gate lines SGDL and SGSL in the non-selected strings NS0 and NS3. The serially connected transistors are not connected to the source line SL and the bit line BL in the non-selected strings NS0 and NS2.

Furthermore, the voltage Vneg is able to be applied to all of the word lines WL, WLDS, and WLDD in the non-selected string NS0. Thus, all of the transistors MT, DST, and DDT of the non-selected string NS0 are turned off. The hindering of an accurate reading from the selected string NS1 due to the current path formed in the non-selected string NS0 side of the pillar 15 is further suppressed.

Furthermore, the voltage Vneg is applied to all of the word lines WL, WLDS, and WLDD also in the non-selected string NS3. For that reason, all of the transistors MT, DST, and DDT are turned off also in the non-selected string NS3. For that reason, in the pillar 15 shared by the non-selected strings NS2 and NS3, the current path is formed in the portion of the non-selected string NS2 side by the cell transistors MT, DST, and DDT, but, the current path is not formed in the non-selected string NS3 side.

By the principle described above, only the data of the selected cell transistor MTx of the selected string NS1 are able to be read into the bit line BL.

Modification Example

Figure 10:
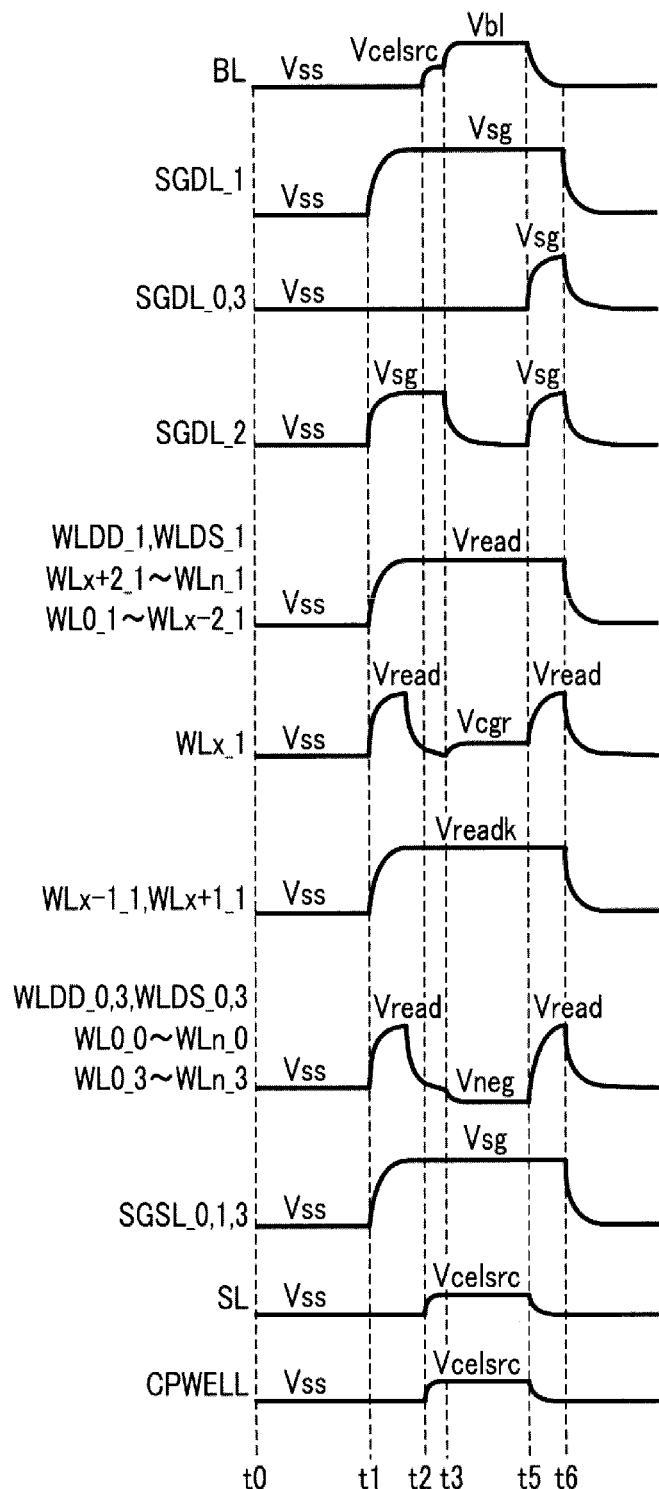
FIG. 10 is a timing diagram of voltages of several wiring lines of a selected block of the memory device of a modification example of the first embodiment during reading.

According to a modification, the voltages are applied as illustrated in FIG. 10 during reading. FIG. 10 is a timing diagram of voltages of several wiring lines of a selected block of the memory device of a modification example of the first embodiment during reading. In the following, description will be made on the points different from those of FIG. 5.

As illustrated in FIG. 10, the sequencer 141 applies the voltage Vsg to the selection gate line SGDL_1 from time t1 to time t6. The sequencer 141 applies the voltage Vsg to the selection gate lines SGSL_0, SGSL_1, and SGSL_3 from time t1 to time t6. As a result, the serially connected transistors of the selected string NS1 are connected to the bit line BL and the source line SL over a period of time from time t1 to time t6.

The sequencer 141 applies the voltage Vsg to the selection gate line SGDL_2 of the non-selected string NS2 from time t1 to time t3. As a result, the serially connected transistors of the non-selected string NS2 are connected to the bit line BL and the source line SL over a period of time from time t1 to time t3.

On the other hand, the sequencer 141 maintains the application of the voltage Vss to the selection gate lines SGDL0_0 and SGDL_3 of the non-selected strings NS0 and NS3 even at time t1. For that reason, the serially connected transistors of the non-selected strings NS0 and NS3 are separated from the source line SL. The application of the voltage Vss continues until time t5.

Furthermore, the sequencer 141, from time t1 to time t6, applies the voltage Vread to the word lines WL0_1 to WLx−2_1, WLx+2_1 to WLn_1, WLDS_1, and WLDD_1 of the selected string NS1 and applies the voltage Vreadk to the word lines WLx−1_1 and WLx+1_1.

By the application of the voltages from time t1 as described above, all of the transistors MT, SST, SDT, SST, and SDT of the selected string NS1 and the non-selected string NS2 are turned on and the channels of the transistors MT, SST, SDT, SST, and SDT are connected to the bit line BL and the source line SL, from time t1 to time t3.

The sequencer 141 applies the voltage Vcelsrc to the bit line BL from time t2. As a result, the voltage Vcelsrc is transferred to the channels of all of the transistors MT, SST, SDT, SST, and SDT of the selected string NS1 and the non-selected string NS2.

The sequencer 141 applies the voltage Vbl to the bit line BL from time t3. The voltage application except for the voltage application to the bit line BL from time t3 is the same as that illustrated in FIG. 5.

According to the modification example, prior to application of a voltage for an actual reading from time t3, the channels of all of transistor MT, SST, SDT, SST, and SDT are connected to the bit line BL and the source line SL in the selected string NS1 and the non-selected string NS2 which shares the control gate electrode film 23 except for the control gate electrode film 23a. In this state, the voltage Vcelsrc is applied to bit line BL and the source line SL and thus, the channels of all of the transistors MT, SST, SDT, SST, and SDT of the non-selected string NS2 are charged toward the voltage Vcelsrc through the transfer of the voltage Vsg. This makes it possible to remove the charges that exist unintentionally in the channels and suppress an erroneous operation in the string NS1 and an erroneous reading due to the charges that exist unintentionally.

Second Embodiment

A memory device of the second embodiment includes the same functional blocks as those of the first embodiment. On the other hand, in the second embodiment, the sequencer 141 is configured to perform operations described in the following. In the second embodiment, description will be made on the points different from those of the first embodiment.

Figure 11:
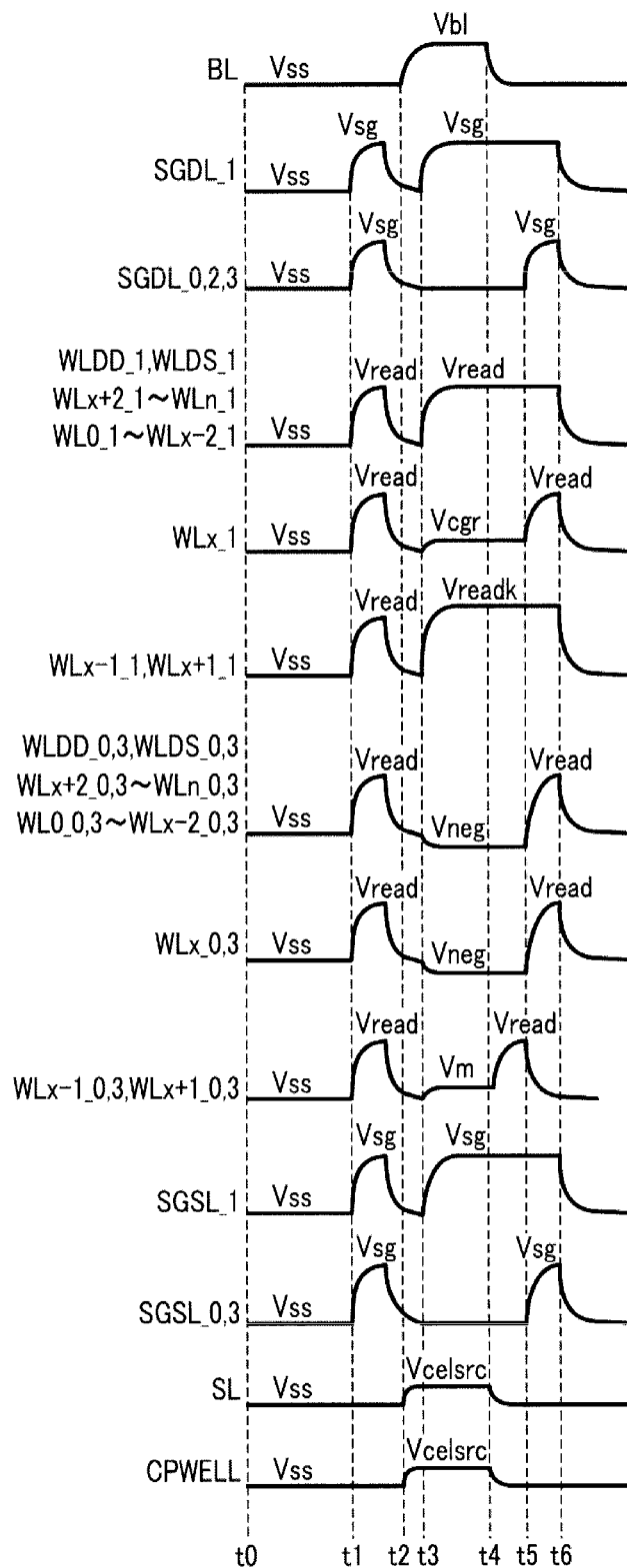
FIG. 11 is a timing diagram of voltages of several wiring lines of a selected block of a memory device of a second embodiment during reading.
Figure 12:
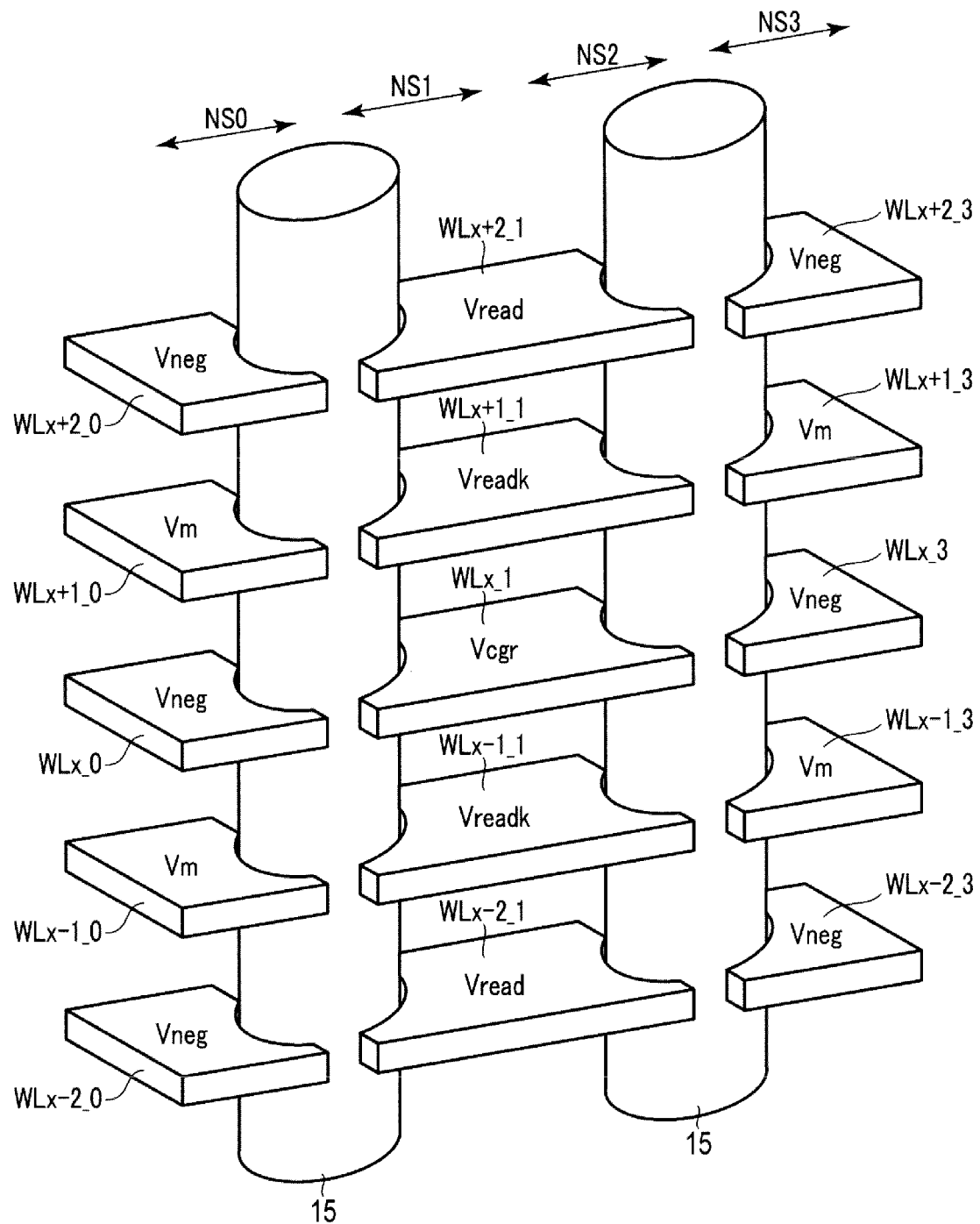
FIG. 12 is a schematic diagram illustrating an example of voltages of several wiring lines of the memory device of the second embodiment at a point in time during reading.

FIG. 11 is a timing diagram of voltages of several wiring lines of a selected block of the memory device of a second embodiment during reading. Also, in the second embodiment, four different states of voltage applications occur in the string NS (string unit SU) similar to the first embodiment. Four states of the string NS during a period between time t3 and time t4, which will be described later, are illustrated in FIG. 12. FIG. 12 illustrates two pillars 15 that share a single bit line BL and a portion of elements related to the pillar 15.

As illustrated in FIG. 11, the sequencer 141 applies the voltage Vm, instead of the voltage Vneg in the first embodiment, to the word line WLx−1_0, WLx+1_0, WLx−1_3, and WLx+1_3, that face at least the word lines WLx−1_1 and WLx+1_1 of the selected string NS1 along the xy plane, from time t3 to time t5. The voltage Vm is greater than the voltage Vneg and is less than the voltage Vread, and has, for example, a positive voltage value. In a case where five or more strings NS are provided in a single block BLK, the voltage Vneg or the voltage Vm may be applied to the word lines WLx+1 and WLx−1 of the non-selected string NS other than the non-selected strings NS0 and NS3.

The voltages applied to several wiring lines between time t3 and time t4 are illustrated in FIG. 13 in a table format.

Advantages (Effects)

Figure 14:
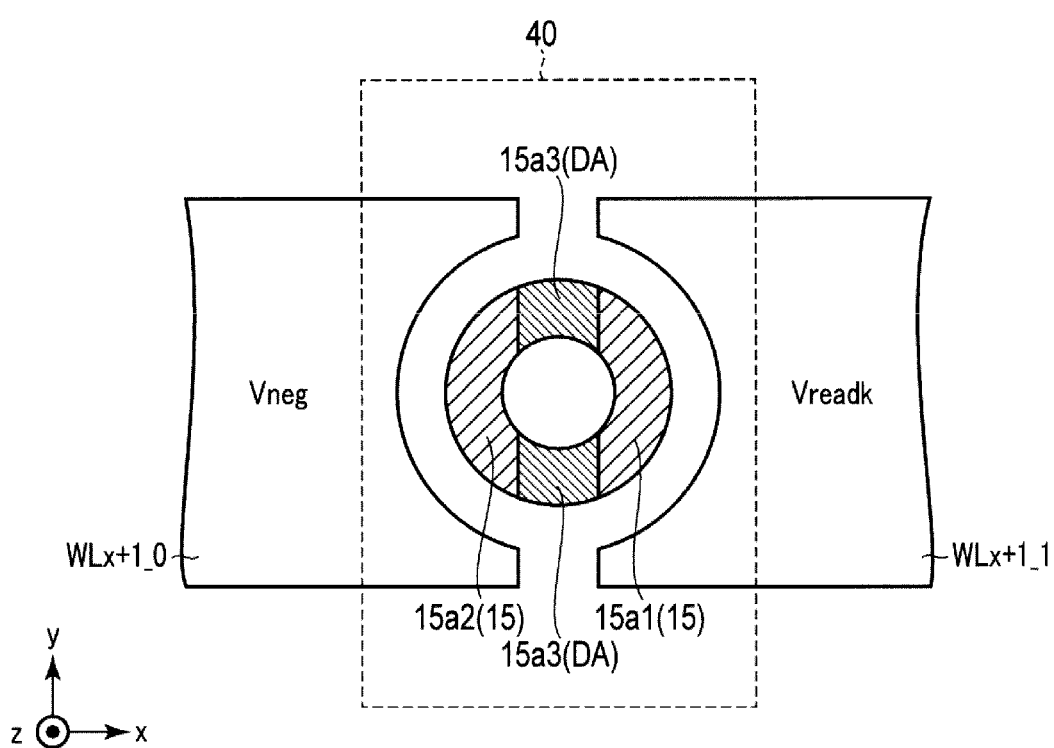
FIG. 14 is a diagram illustrating a state of a certain region of the memory device of the second embodiment during reading.

When the voltage is applied according to the first embodiment, a large potential difference is generated in the region 40 of FIG. 6. As described in the first embodiment, it is expected that the regions 15a1 and 15a2 are electrically isolated from each other, during reading, due to the depletion layer DA of the region 15a3. However, as illustrated in FIG. 14, a potential difference between the regions 15a1 and 15a2 is not able to be maintained due to the depletion layer DA and a leakage current may flow between the regions 15a1 and 15a2 (for example, band-to-band tunneling current) depending on a combination of a size of the pillar 15, a value of the voltage Vreadk, and a value of the voltage Vneg. FIG. 14 illustrates a state in a boundary of the word line WLx+1_0 of the strings NS0 and NS1 in the region 40 along the xy plane during reading of the memory device of the second embodiment. Flowing of the leakage current may result in inability to maintain the potential of the word line WLx+1_1 to the Vreadk and may cause an erroneous reading from the selected string NS1.

The high potential difference in the pillar 15 caused by the voltage Vreadk and the voltage Vneg may also be generated between the word lines WLx+1_1 and WLx+1_3. The high potential difference caused by the voltage Vreadk and the voltage Vneg may also be generated between the word lines WLx−1_0 and WLx−1_1. Furthermore, the high potential difference caused by the voltage Vreadk and the voltage Vneg may also be generated between the word lines WLx−1_1 and WLx−1_3.

According to the second embodiment, in the memory device 100, during reading, the voltage VM is applied to portions of the word lines WL (WLx−1 and WLx+1) which are adjacent to the selected word line WLx. The voltage Vm is higher than the voltage Vneg and thus, the potential difference between the regions 15a1 and 15a2 is small and is at least smaller than that of the first embodiment even when the word line WL adjacent to the selected word line WLx receives the voltage Vreadk. For that reason, a potential difference of a portion where the largest potential difference is generated (a portion illustrated in the region 40) is reduced in the pillar 15 and unintentional flowing of tunneling current in the portion can be suppressed. Thus, erroneous reading of the memory device 100 can be further suppressed.

Figure 15:
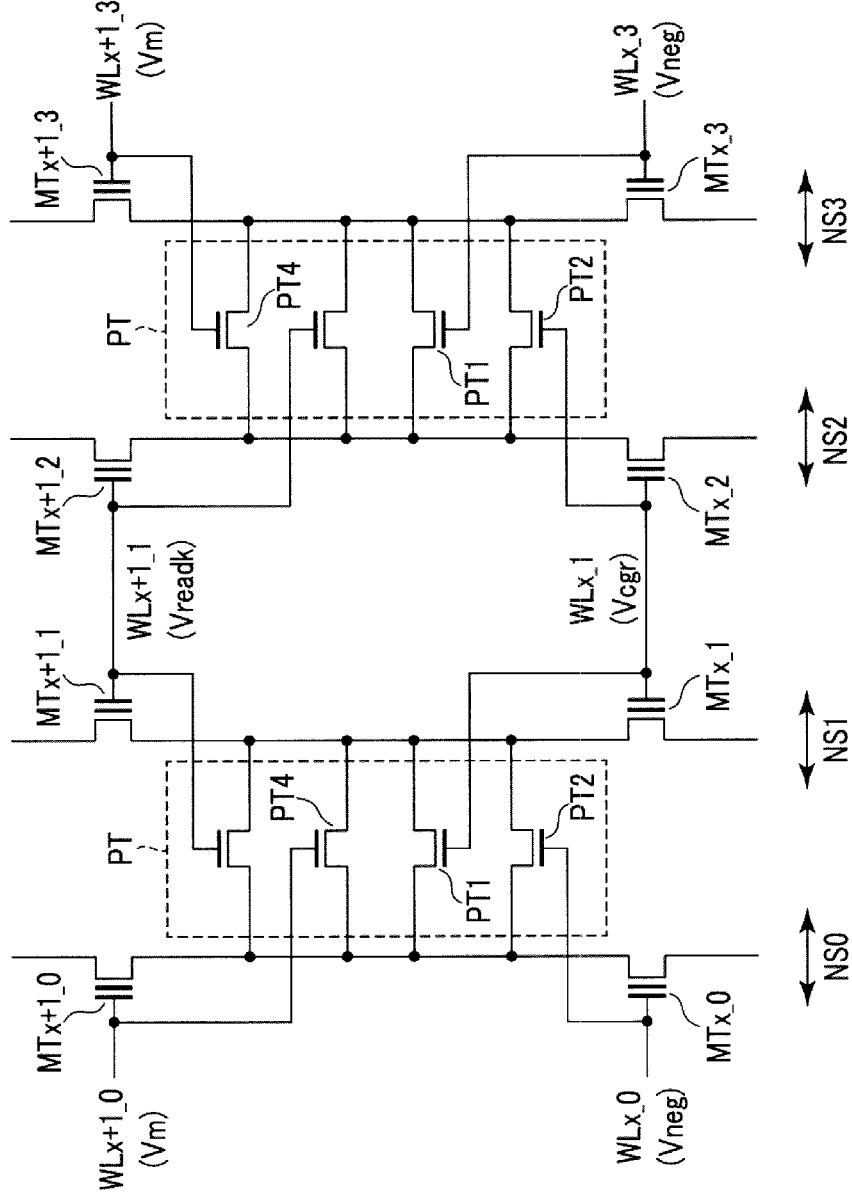
FIG. 15 is a diagram illustrating an equivalent circuit of a portion of the memory device of the second embodiment.

However, the parasitic transistor PT can be turned on by the application of the voltage Vm. FIG. 15 illustrates an equivalent circuit of a portion of the memory device 100 during reading. As illustrated in FIG. 15, by the combination of the same elements as those described with reference to FIG. 9, the parasitic transistor PT4 which uses the word line WLx+1_0 as a gate is formed between the strings NS0 and NS1 and formed between the strings NS2 and NS3. The parasitic transistor PT4 is turned on to thereby make it possible to electrically connect two current paths (regions 15a1 and 15a2) in each pillar 15.

However, the word line WLx_0, which is parallel with the word line WLx, in the non-selected strings NS (for example, NS0 and NS3) receives the voltage Vneg so that the transistor MTx_0 is turned off. For that reason, for example, even though two current paths are electrically connected, a piece of information maintained by the selected cell transistor MTx_1 is correctly reflected in the read current. That is, the piece of information maintained by the selected cell transistor MTx_1 is able to be correctly read.

In order to further make the potential difference in the region 40 smaller, the voltage Vm preferably has a voltage value which causes the difference between the voltage Vm and the voltage Vreadk to be smaller. On the other hand, the voltage Vm preferably has a voltage value which causes the difference between the voltage Vm and the voltage Vneg to be sufficiently small. This is for suppressing the current flowing in the parasitic transistor PT4 and maintaining a breakdown voltage between the word line WL receiving the voltage Vm and the word line WL receiving the voltage Vneg. In the second embodiment, the voltage Vm has a voltage value capable of maintaining the breakdown voltage between two word lines WL receiving the voltage Vm and the voltage Vreadk and the breakdown voltage between the two word lines WL receiving the voltage Vm and the voltage Vneg. Thus, the memory device 100 is able to be operated more normally.

Modification Example

The charges illustrated in FIG. 16 may be applied to the non-selected strings NS0 and NS3 between time t3 and time t4. FIG. 16 illustrates a first modification example of voltages of the memory device of the second embodiment applied at a certain point in time during reading.

As illustrated in FIG. 16, the sequencer 141 applies a voltage Vm2 to the remaining word lines WLs, that is, the word lines WL0 to WLx−2, and WLx+2 to WLn, other than the word lines WLx−1, WLx, and WLx+1, in the non-selected strings NS0 and NS3. The voltage Vm2 is larger than the voltage Vneg and is smaller than the voltage Vm, and has, for example, a positive voltage value. The voltage is applied such that the potential difference between the word lines WL0 to WLx−2 and WLx+2 to WLn and the word lines WL0 to WLx−2 and WLx+2 to WLn corresponding to the selected string NS1 is Vread−Vm2 in the non-selected strings NS0 and NS3. As a result, the potential difference between each pair of the word lines WL is smaller than those of FIG. 12 to FIG. 14 and flowing of tunneling current is prevented without maintaining the required potential difference, by the same principle as that described with reference to FIG. 15.

The dummy word lines WLDS_0, WLDD_0, WLDS_3, and/or WLDS_3 may receive a voltage Vm2 from the sequencer 141. Accordingly, it is possible to reduce a potential difference between dummy word lines WLDS of separate strings NS and/or another potential difference between dummy word lines WLDS of separate strings NS.

Figure 17:
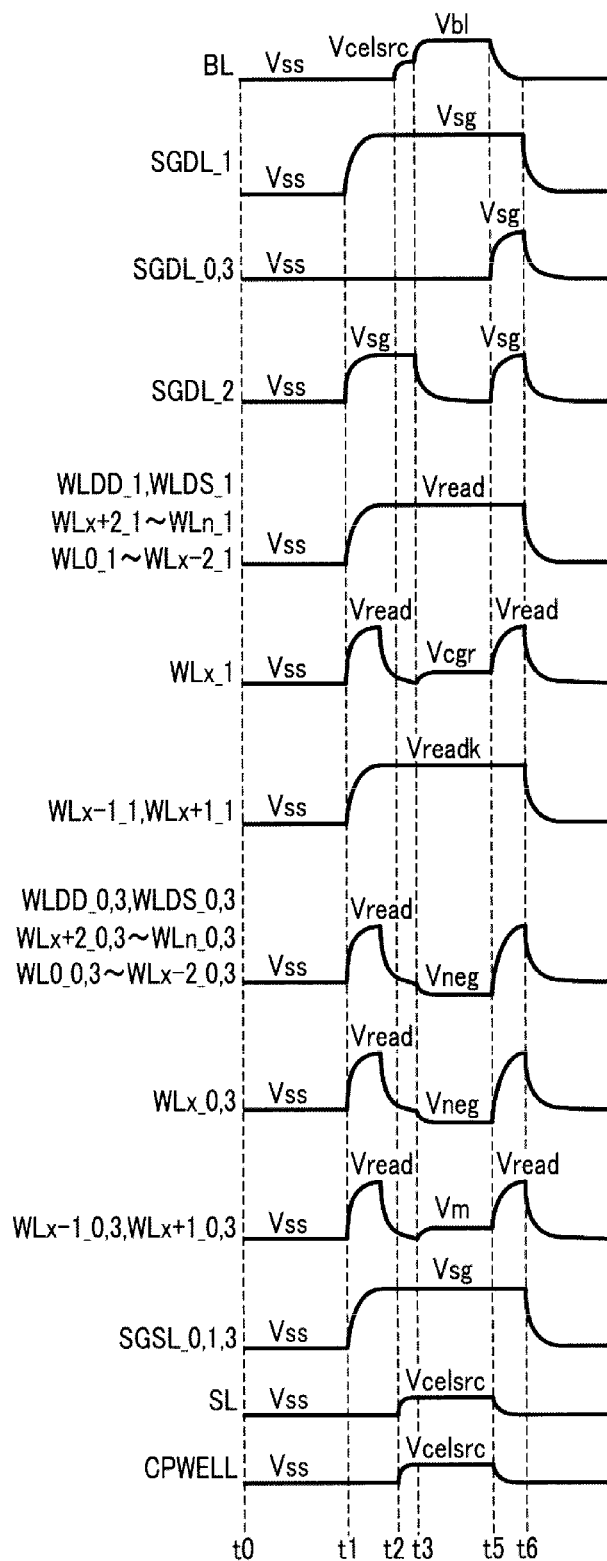
FIG. 17 is a timing diagram illustrating a second modification example of voltages of the memory device of the second embodiment applied at a point in time during reading.

Furthermore, as illustrated in FIG. 17, the same voltage application as that of FIG. 11 may be applied to the second embodiment. FIG. 17 is a timing diagram of voltages of several wiring lines of a selected block of the memory device of a second modification example of the second embodiment during reading. In the following, description will be made on the points different from those of FIG. 12.

As illustrated in FIG. 17, the sequencer 141 applies the voltage Vsg to the selection gate line SGDL_1 from time t1 to time t6. The sequencer 141 applies the voltage Vsg to all of the selection gate lines SGSL_0, SGSL_1, and SGSL_3 from time t1 to time t6.

The sequencer 141 applies the voltage Vsg to the selection gate line SGDL_2 of the non-selected string NS2 from time t1 to time t3. On the other hand, the sequencer 141 maintains the application of the voltage Vss to the selection gate lines SGDL0_0 and SGDL_3 of the non-selected strings NS0 and NS3 even at time t1. The application of the voltage Vss continues until time t5.

Furthermore, the sequencer 141 applies the voltage Vread to the word lines WL0_1 to WLx−2_1, WLx+2_1 to WLn_1, WLDS_1, and WLDD_1 of the selected string NS1 and applies the voltage Vreadk to the word lines WLx−1_1 and WLx+1_1 from time t1 to time t6.

The sequencer 141 applies the voltage Vcelsrc to the bit line BL from time t2. The sequencer 141 applies the voltage Vb1 to the bit line BL from time t3.

According to the second modification example, an advantage of a combination of the modification example of the first embodiment and the second embodiment may be obtained.

Third Embodiment

The third embodiment is related to writing in the memory device 100.

Figure 18:
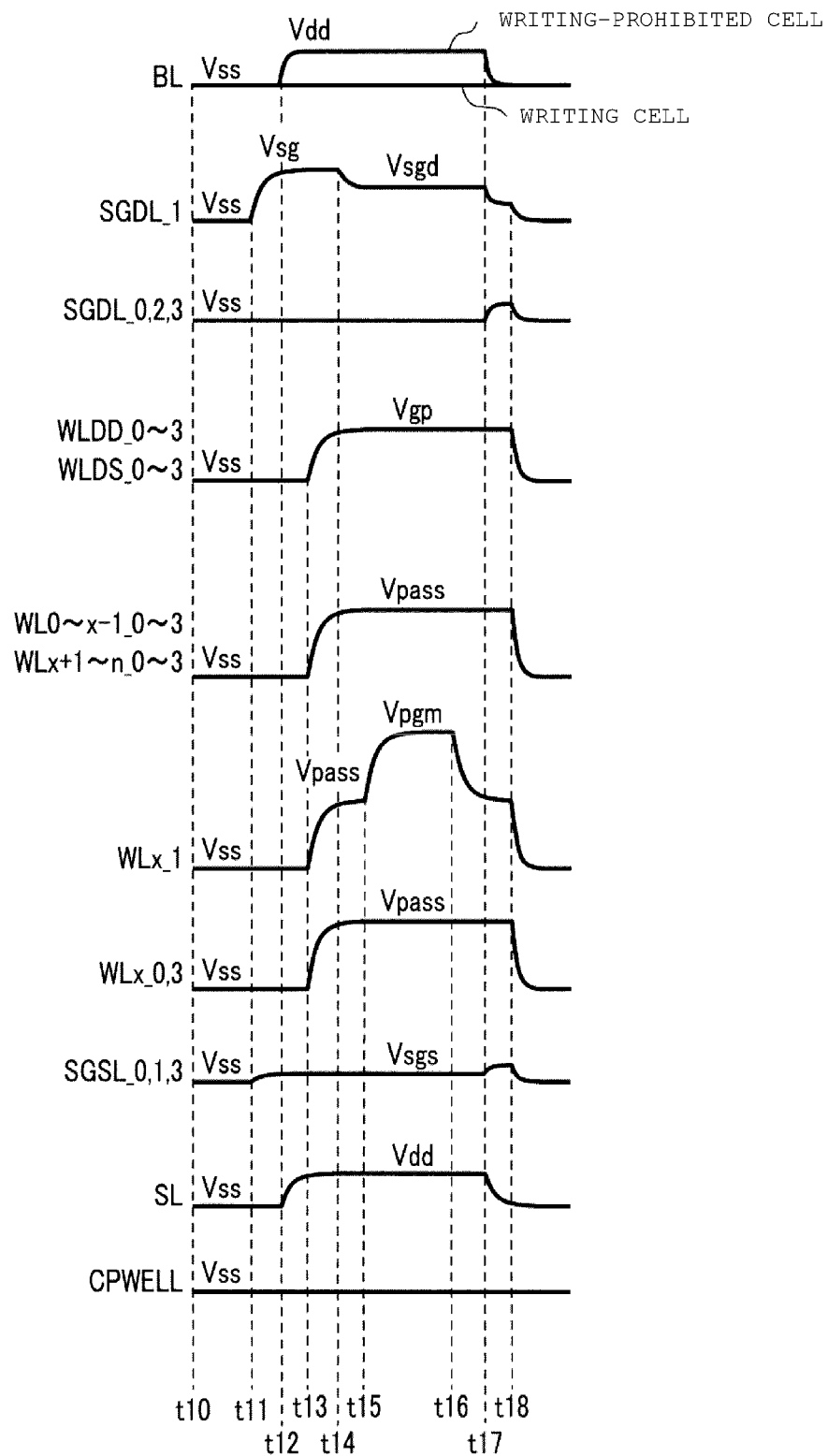
FIG. 18 is a timing diagram of voltages of several wiring lines of a selected block of a memory device of a third embodiment during writing.

FIG. 18 is a timing diagram of potentials of several wiring lines of a selected block of the memory device of the third embodiment during writing. Similar to the first embodiment and the second embodiment, in the following, description will be made using a single string NS of each string unit SU as a representative and operations described occur in parallel in the plurality of strings NS. Similar to the first embodiment, the string NS1 is a selected string to be written. The word line WLx, that is, the word line WLx_1 is a selected word line.

As illustrated in FIG. 18, the sequencer 141 applies the voltage Vss to all of wiring lines at a time point time t10.

The sequencer 141 applies the voltage Vsg to the selection gate line SGDL_1 of the selected string NS1 from time t11. As a result, the selection gate transistor SDT 1 is turned on and serially connected transistors (a set of transistors MT, DST, and DST) are connected to the bit line BL in the selected string NS1. On the other hand, the sequencer 141 continues to apply the voltage Vss to the selection gate lines SGDL_0, SGDL_2, and SGDL_3 of the non-selected strings NS0, NS2, and NS3. For that reason, the serially connected transistors are maintained in a state of being disconnected from the bit line BL in the non-selected strings NS0, NS2, and NS3.

The sequencer 141 applies the voltage Vsgs to all of selection gate lines SGSL_0 to SGSL_3 from time t11. The voltage Vsgs is larger than the voltage Vss and has a voltage magnitude which is not large enough to turn on the selection gate transistor SST. For that reason, the serially connected transistors are not connected to the source line SL in any of all selected strings NS. Accordingly, in the selected string NS1, the serially connected transistors are in a state of being connected to the bit line BL and in the non-selected strings NS0, NS2, and NS3, the serially connected transistors are not connected to the bit line BL as well as the source line SL and are electrically floating.

The sequencer 141 applies the voltage Vdd to the source line SL from time t12. The sequencer 141 continues to apply the voltage Vss to the bit line (a writable bit line) BL connected to the selected string (a writable selected string) NS1 which includes the selected cell transistor MT which injects electrons into the floating gate electrode film 19 by writing. On the other hand, the sequencer 141 continues to apply the voltage Vdd to the bit line (a writing prohibition bit line) BL connected to the selected string (a writing-prohibited selected string) NS1 which includes the selected cell transistor MT which does not inject electrons into the floating gate electrode film 19 by writing, from time t12.

The sequencer 141 applies the voltage Vgp to the word lines WLDD_0 to WLDD_3 and WLDS_0 to WLDS_3 of all of the strings NS from time t13. The voltage Vgp is higher than the voltage Vss and has a voltage magnitude which is large enough to turn on the transistors WLDD and WLDS.

The sequencer 141 applies the voltage Vpass to the non-selected word lines WL0_0 to WLx−1_0, WL0_1 to WLx−1_1, WL0_2 to WLx−1_2, WL0_3 to WLx−1_3, WLx+1_0 to WLn_0, WLx+1_1 to WLn_1, WLx+1_2 to WLn_2, and WLx+1_3 to WLn_3 of all of the strings NS from time t13. The voltage Vpass is small enough to be able to suppress erroneous writing into the non-selected cell transistor MTi (i≠x) in the selected string NS1 and is large enough to be able to increase the channels, to the extent that an increase of a threshold voltage of the cell transistor MTx can be suppressed, by coupling in the selected string NS2 sharing the word lines with the selected string NS.

The sequencer 141 also applies the voltage Vpass to the selected word line WLx_1 of the selected string NS1 from time t13. Furthermore, the sequencer 141 also applies the voltage Vpass to the word lines WLx_0 and WLx_3 facing the selected word line WLx_1 of the non-selected strings NS0 and NS3 from time t13 by coupling.

All of the transistors MT, DDT, and SDT are turned on in the selected string NS1 by the application of the voltage Vpass from time t13. The channels of the non-selected strings NS0, NS2, and NS3 are electrically floating and thus, the potentials of the channels of the non-selected strings NS0, NS2, and NS3 are increased by the application of the voltage Vpass to be electrically floating.

The sequencer 141 applies the voltage Vsgd to the selection gate line SGDL_1 of the selected string NS1 from time t14. The voltage Vsgd is smaller than the voltage Vsg. The voltage Vsgd has a voltage magnitude which is large enough to turn off the selection gate transistor SDT 1 of the writing-prohibited selected string NS1 while maintaining the selection gate transistor SDT 1 of the writable selected string NS1 in an on state. The selection gate transistor SDT 1 of the writable selected string NS1 is maintained in an on state by the application of the voltage Vsgd. As a result, the channel of the writable selected string NS1 continues to be connected to the bit line BL and maintains a state where the voltage Vss is applied. On the other hand, the selection gate transistor SDT_1 of the writing-prohibited selected string NS1 is turned off by the application of the voltage Vsgd. As a result, the channels of the writing-prohibited selected string NS1 is disconnected from the bit line BL to be electrically floating.

The sequencer 141 applies the voltage Vpgm to the selected word line WLx_1 of the selected string NS1 from time t15. The voltage Vpgm is higher than the voltage Vpass. A large potential difference, due to the voltage Vpgm and the voltage Vss, is formed between the selected word line WLx_1 and the channel by the application of the voltage Vpgm in the writable selected string NS1. As a result, electrons are injected into the floating gate electrode film 19 of the selected cell transistor MTx_1 of the selected string NS1 connected to the writable bit line BL.

On the other hand, the sequencer 141 continues to apply the voltage Vpass to non-selected word lines WL0_1 to WLx−1_1 and WLx+1_1 to WLn_1 of the selected string NS1 even from time t15. The voltage Vpass is sufficiently smaller than the voltage Vpgm. For that reason, the potential difference formed between the non-selected word lines WL0 to WLx−1 and WLx+1 to WLn and the channels by the voltage Vpass and the voltage Vss is sufficiently smaller than the difference between the voltage Vpgm and the voltage Vss even in the writable selected string NS1. For that reason, electrons are not injected into the floating gate electrode film 19, writing is suppressed, or writing does not occur in the non-selected cell transistors MT0 to MTx−1 and MTx+1 to MTn of the writable selected string NS1.

Writing into the cell transistor MT0 to MTn is suppressed or writing does not occur in the writing-prohibited selected string NS1 even by the application of the voltage Vpgm. This is because the writing-prohibited selected string NS1 is electrically floating, the channels are coupled with the word lines WL0_1 to WLn_1, the potentials of channels are increased by the application of the voltage Vpgm and the voltage Vpass to the word lines WL0_1 to WLn_1, and a small potential difference is only formed between the word lines WL0_1 to WLn_1 and the channels. The voltage Vpass is set in such a way that even if the cell transistor MTx of the writing-prohibited selected string NS1 receives the voltage Vpgm in a gate, the channel of the writing-prohibited selected string NS1 has a potential to suppress the writing.

The state of the non-selected string NS2 from time t15 is the same as that of the writing-prohibited selected string NS1. Specifically, the potential of the channel of the non-selected string NS2 is increased by coupling and there is only a small potential difference between the word lines WL0_1 to WLn_1 and the channel. For that reason, writing into the cell transistor MT0 to MTn is suppressed or writing does not occur, even by the application of the voltage Vpgm, in the non-selected string NS2.

Furthermore, the sequencer 141 continues to apply the voltage Vpass to the word line WLx_0 and WLx_3 of the non-selected strings NS0 and NS3 even from time t15. Even at time t15, the non-selected strings NS0 and NS3 are also electrically floating. For that reason, even from time t15, the channels of the non-selected strings NS0 and NS3 maintain a state of being increased to a value close to the voltage Vpass by the coupling with the word lines WL0_0 to WLn_0 and WL0_3 to WLn_3, and there is only a small potential difference between the word lines WL0_0 to WLn_0 and WL0_3 to WLn_3. Accordingly, writing into the cell transistors MT0 to MTn is suppressed or writing does not occur even in the non-selected strings NS0 and NS3.

Writing due to injection of electrons is performed by the voltage application from time t15 to time t16. The sequencer 141 returns the voltage, which is applied to the selected word line WLx_1, to the voltage Vpass from time t16.

The sequencer 141 returns the voltage applied to the writing prohibition bit line BL and the source line SL to the voltage Vss from time t17. The sequencer 141 decreases the voltage applied to the selection gate line SGDL_1 of the selected string NS1 toward the voltage Vss from time t17. The sequencer 141 temporarily increases the voltage of the selection gate line SGDL of the non-selected strings NS0, NS2, and NS3 and the voltage of the selection gate lines SGSL of all the strings NS from time t17.

The sequencer 141 returns the voltage of the selection gate line SGDL of the non-selected strings NS0, NS2, and NS3, the voltage of the selection gate lines SGSL of all of the strings NS, and the voltage of all the word lines WL of all the strings NS to the voltage Vss from time t18, and ends writing.

The potential applied to several wiring lines between time t15 and time t16 are illustrated in FIG. 19 in a table format.

Advantages (Effects)

According to the third embodiment, in the memory device 100 having the shared pillar structure, during writing, the voltage Vss is applied to the selection gate lines SGDL and SGSL of the non-selected strings NS0, NS2, and NS3. For that reason, the non-selected string NS is electrically floating. On the other hand, while the voltage Vss is applied to the writable bit line BL and the voltage Vdd is applied to the writing prohibition bit line BL, the voltage Vsgd and the voltage Vsgs are applied to the selection gate lines SGDL and SGSL of the selected string NS1. For that reason, the writing-prohibited selected string NS1 is electrically floating and the writable selected string NS1 continues to be connected to the bit line BL. Thus, the non-selected string NS and the writing-prohibited selected string NS1 are electrically floating and the writable selected string NS1 is connected to bit line BL.

In the selected string NS1, the voltage Vgp is applied to the word lines WLDD and WLDS, the voltage Vpgm is applied to the selected word line WL, and the voltage Vpass is applied to the non-selected word line WL while the writable selected string NS1 is connected to the bit line BL. For that reason, only the small potential difference is formed between the word line WL and the channel in the non-selected cell transistor MT of the writable selected string NS1. On the other hand, a large potential difference is formed between the word line WL and the channel in the selected cell transistor MT of the writable selected string NS1. Writing occurs in the selected cell transistor MT of the writable selected string NS1, and writing is suppressed or writing does not occur in the non-selected transistor MT of the writable selected string NS.

In the selected string NS1, the voltage Vgp is applied to the word lines WLDD and WLDS, the voltage Vpgm is applied to the selected word line WL, and the voltage Vpass is applied to the non-selected word line WL while the writing-prohibited selected string NS1 is electrically floating. For that reason, only the small potential difference is formed between the word line WL and the channel in the cell transistor MT of the writing-prohibited selected string NS1.

Thus, writing is suppressed or, writing does not occur in the cell transistor MT of the writing-prohibited selected string NS1.

Furthermore, in the non-selected string NS, the voltage Vgp is applied to the word lines WLDD and WLDS and the voltage Vpass is applied to all the word lines WL while the non-selected string NS is electrically floating. For that reason, only the small potential difference is formed between the word line WL and the channel and writing into the cell transistor MT is suppressed or the writing does not occur in the non-selected string NS.

As such, writing occurs in the selected transistor MT of the writable selected string NS1, and writing is suppressed or writing does not occur in the non-selected transistor MT of the writable selected string NS1, the writing-prohibited selected string NS1, and the non-selected string NS. That is, in the memory device 100 having the shared pillar structure, writing is able to be selectively performed into the selected transistor MT, which is subjected to be writing, of the selected string NS.

Fourth Embodiment

The fourth embodiment is related to erasure in the memory device 100.

Figure 20:
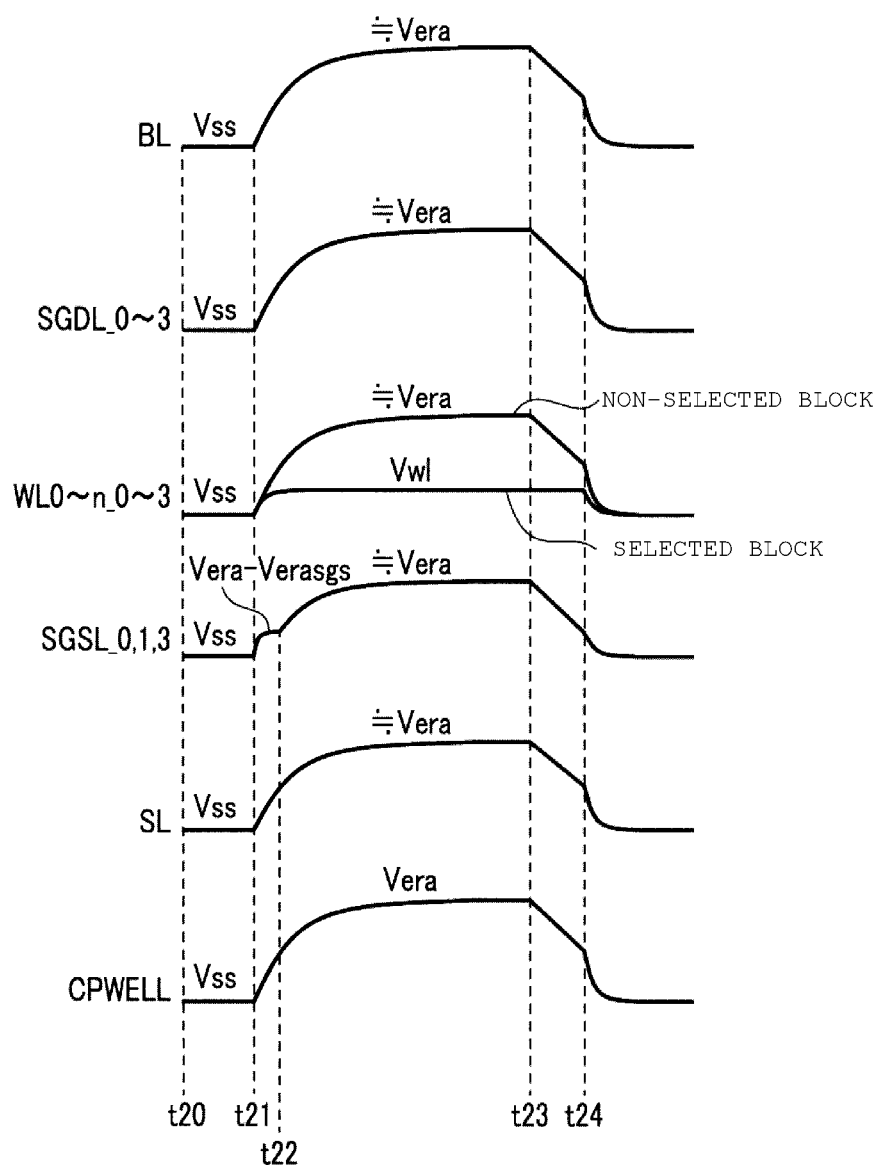
FIG. 20 is a timing diagram of voltages of several wiring lines of a selected block and an non-selected block of a memory device of a fourth embodiment during erasing.

FIG. 20 is a timing diagram of potentials of several wiring lines of a selected block and an non-selected block of the memory device of the fourth embodiment during erasing. Similar to the first embodiment, in the following, description will be made using a single string NS of a selected block BLK as a representative and operations described occur in parallel in all of strings NS of the selected block BLK. The erasure will be described with reference to FIG. 3 and FIG. 21.

As illustrated in FIG. 20, at a time point time t20, the sequencer 141 applies the voltage Vss to all of wiring lines.

The sequencer 141 makes the bit line BL, the selection gate lines SGDL_0 to SGDL_3, and all of the word lines WL of the non-selected block into an electrically floating state from time t21. The sequencer 141 applies the voltage Vera to the CP well 12 from time t21. The voltage Vera is higher than the voltage Vss. The voltage of the CP well 12 is transferred to the first portion 15a of the pillar 15 from the lower end along the z-axis (an end of selection gate transistor SST side). As a result, a bottom portion of the first portion 15a (body of transistor MT) of the pillar 15 is increased to a voltage (≈Vera) close to a voltage value of the voltage Vera.

Furthermore, the sequencer 141 applies the voltage Vera–the voltage Verasgs to all selection gate lines SGSL_0 to SGSL_3 from time t21. The voltage Verasgs is a potential difference between the body 15a of the selection gate transistor SST in a state of being in a charge accumulation state and selection gate line SGSL receiving the voltage Vera–the voltage Verasgs, in other words, has a small voltage value enough to make the body 15a of the selection gate transistor SST into the charge accumulation state. It becomes easy for the voltage of the CP well 12 to be transferred to the upper portion of the body 15a through the selection gate transistor SST by the application of the voltage Vera–the voltage Verasgs.

The voltage Vera is applied to the CP well 12 and thus the voltage Vera of the CP well 12 is applied to the selection gate transistor SST in the body 15a. As a result, a bias voltage is applied from the body 15a to the diffusion layer 37 (a portion of source line SL) in a forward direction. For that reason, the voltage of the body 15a is transferred to the conductive films 39 and 50 (source line SL) and the source line SL is increased from the voltage Vss to a voltage value (≈Vera) close to the voltage Vera.

The conductive films 43 and 50 face the conductive film 33 (bit line BL) and accordingly, the conductive films 43 and are capacitively coupled to the conductive film 33.

Accordingly, when the voltage of the source line SL is increased, the bit line BL is increased to the voltage value (≈Vera) close to the voltage Vera due to the capacitive coupling. The conductive film 33 as the bit line BL is electrically connected to the first portion (body) 15a of the pillar 15 through the via 31 and the conductive film 29, and thus the portion of the upper side (selection gate transistor SDT side) along the z-axis of the body 15a is increased to the voltage (≈Vera) close to the voltage Vera due to the increase of the voltage of the bit line BL. Thus, the voltage of the body is increased to the voltage (≈Vera) close to the voltage Vera in its entirety.

The body 15a is capacitively coupled to the conductive film 23 (word line WL and selection gate line SGDL). When the voltage of the body 15a is increased, the voltages of the selection gate line SGDL and the word line WL are increased to the voltage (≈Vera) close to the voltage Vera by the capacitive coupling.

The sequencer 141 applies the voltage Vw1 to all of the word lines WL of the selected block BLK from time t21. The voltage Vw1 is higher than the voltage Vss and is lower than the voltage Vera.

The sequencer 141 makes all the selection gate lines SGSL_0 to SGSL_3 into an electrically floating state from time t22. As a result, when the voltage of the body 15a is increased, the voltages of the selection gate lines SGSL_0 to SGSL_3 are increased to the voltage (≈Vera) close to the voltage Vera due to the capacitive coupling with the body 15a.

An erasure by drawing out of electrons is performed by the application of the voltage in a period of time from time t22 to time t23. That is, a large potential difference is formed between the body 15a and the word line WL in the selected block BLK due to the voltage close to the voltage Vera and the voltage Vw1. The electrons in the floating gate electrode film 19 of the selected block BLK are drawn into the body 15a by the potential difference, and the erasure is performed.

On the other hand, the word line WL is electrically floating in the non-selected block BLK from time t21. For that reason, when the voltage of the body 15a is increased due to the capacitive coupling with the body 15a, the word line WL is increased to the voltage (≈Vera) close to the voltage Vera. A potential difference is not formed between the word line WL and the body 15a, and the erasure is not performed in the non-selected block BLK.

The sequencer 141 discharges the CP well 12, the bit line BL, and the source line SL at time t23. As a result, the voltages, which are increased due to the coupling, of the selection gate lines SGDL and SGSL of all the strings STR, and all the word lines WL0 to WLn, the bit line BL, and the source line SL are decreased toward the voltage Vss.

The sequencer 141 discharges the voltage applied to the selected word lines SGDL and SGSL and the word lines WL0 to WLn of the selected block BLK to the voltage Vss from time t24 and ends the erasure.

The potentials of several wiring lines between time t21 and time t23 are illustrated in FIG. 21 in a table format.

Advantages (Effects)

According to the fourth embodiment, in the memory device 100 having the shared pillar structure, the voltage Vera is applied to the CP well 12 and a voltage, which is the same extent to the voltage Vera, is applied to the selection gate line SGSL while all of wiring lines of the block BLK are electrically floating, during erasing. As a result, the voltage of the body 15a is increased to the voltage value close to the voltage Vera through the selection gate transistor SST by a voltage increase of various wiring lines due to the coupling between the selection gate transistor SST, in which the body 15a is in the charge accumulation state, and various wiring lines. In this state, the voltage Vw1 is applied to the word line WL of the selected block BLK. As a result, a large potential difference is formed between the body 15a and the word line WL in the selected block BLK and electrons are drawn into the body 15a, and the erasure is performed. On the other hand, the word line WL is electrically floating and a large potential difference between the word line WL and the body is not formed in the non-selected block BLK, and the erasure is not performed. That is, selective erasure with respect to the selected block BLK becomes possible.

In the present specification and claims, the term "connection" includes a direct connection and a connection through a conductive element.

In a case where the memory device 100 is a NAND-type flash memory, the memory device 100 may perform the following operations or has the following configuration.

In a multi-level reading operation (read), when the threshold voltages are set as a level A, a level B, and a level C in ascending order of the threshold voltage, a voltage to be applied to a selected word line for a level A reading operation is, for example, in a range of 0 V to 0.55 V. The voltage is not limited thereto and may include any range of 0.1 V to 0.24 V, of 0.21 V to 0.31 V, of 0.31 V to 0.4 V, of 0.4 V to 0.5 V, of 0.5 V to 0.55 V, and the like. A voltage to be applied to a selected word line for a level B reading operation is, for example, of 1.5 V to 2.3 V. The voltage is not limited thereto and may include any range of 1.65 V to 1.8 V, of 1.8 V to 1.95 V, of 1.95 V to 2.1 V, of 2.1 V to 2.3 V, and the like. A voltage to be applied to a selected word line for a level C reading operation is, for example, of 3.0 V to 4.0 V. The voltage is not limited thereto and may include any range of 3.0 V to 3.2 V, of 3.2 V to 3.4 V, of 3.4 V to 3.5 V, of 3.5 V to 3.6 V, of 3.6 V to 4.0 V, and the like. A reading operation time (tR) may be, for example, any range of 25 μs and 38 μs, of 38 μs and 70 μs, of 70 μs and 80 μs, and the like.

The writing operation includes a program operation and a verification operation. In the writing operation, a voltage applied to the selected word line during the program operation for the first time is, for example, a range of 13.7 V to 14.3 V. The voltage is not limited thereto and may include, for example, any range of 13.7 V to 14.0 V, of 14.0 V to 14.6 V, and the like. The voltage applied to the selected word line for the first time when writing an odd-numbered word line may differ from the voltage applied to the selected word line for the first time when writing an even-numbered word line. When an incremental step pulse program (ISPP) is used for the program operation, a step-up voltage may be, for example, approximately 0.5 V. The voltage to be applied to the non-selected word line may be, for example, a range of 6.0 V to 7.3 V. The voltage is not limited thereto and may be in a range, for example, of 7.3 V to 8.4 V, and may be 6.0 V or less. A pass voltage to be applied may differ depending on whether the non-selected word line is either an odd-numbered word line or an even-numbered word line. The writing operation time (tProg) may be in a range, for example, of 1000 μs to 1500 μs, of 1500 μs to 2000 μs, and of 2000 μs to 3000 μs.

In the erasing operation, a voltage applied to a well, which is disposed at the upper part of a semiconductor substrate and above a memory cell, for the first time is in a range, for example, of 12 V to 13.6 V. The voltage is not limited thereto and may be in any range, for example, of 13.6 V to 14.8 V, of 14.8 V to 19.0 V, of 19.0 V to 19.8 V, and of 19.8 V to 21 V. The erasing operation time (tErase) may be in a range, for example, of 1000 μs to 3000 μs, of 3000 μs to 5000 μs, and of 5000 μs of 10000 μs.

The memory cell may have a structure as described in the following, for example. The memory cell includes a charge accumulation layer disposed on a semiconductor substrate, such as a silicon substrate, through a tunnel insulating film having a film thickness of 4 nm to 10 nm. The charge accumulation layer may be configured in a stacked structure of an insulating film such as a silicon oxide (SiON) film or a silicon nitride (SiN) film having a film thickness of 3 nm to 8 nm and a poly-silicon (Poly-Si) film having a film thickness of 3 nm to 100 nm. A metal such as ruthenium (Ru) may be added to a portion of the charge accumulation layer. An insulating film may be formed on the charge accumulation layer. The insulating film includes a High-k film having a film thickness of 4 nm to 10 nm which is sandwiched by, for example, a lower-layer silicon oxide ($SiO_2$) film having a film thickness of 3 nm to 10 nm and an upper-layer silicon oxide film having a film thickness of 3 nm to 10 nm. Materials of the High-k film may include hafnium oxide (HfO) or the like. The film thickness of the silicon oxide film may be greater than that of the High-k film. A control electrode having a film thickness of 30 nm to 100 nm is provided on the insulating film through a film having a thickness of 1 nm to 10 nm. Such a film includes, for example, a metal oxide film such as tantalum oxide (TaO), a metal oxide film or a metal nitride film such as tantalum nitride (TaN), tungsten nitride (WN), or aluminum oxide (AlO). Tungsten (W) may be used in the control electrode. An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a substrate;
   a plurality of bit lines above the substrate extending in a first direction and being separated from one another in a second direction, the second direction crossing the first direction;
   a first semiconductor column extending in a third direction between the substrate and one of the bit lines, the third direction crossing the first direction and the second direction;
   a first conductive layer on a first side of the first semiconductor column in the first direction, a first memory cell being formed between the first conductive layer and the first semiconductor column;
   a second conductive layer on a second side of the first semiconductor column, opposite to the first conductive layer in the first direction, a second memory cell being formed between the second conductive layer and the first semiconductor column;

a third conductive layer above the first conductive layer and on the first side of the first semiconductor column, wherein no conductive layer is between the first and third conductive layers in the third direction, a third memory cell being formed between the third conductive layer and the first semiconductor column;

a fourth conductive layer on the second side of the first semiconductor column, opposite to the third conductive layer in the first direction, a fourth memory cell being formed between the fourth conductive layer and the first semiconductor column;

a fifth conductive layer above the third conductive layer and on the first side of the first semiconductor column, a fifth memory cell being formed between the fifth conductive layer and the first semiconductor column;

a sixth conductive layer above the fourth conductive layer and on the second side of the first semiconductor column, opposite to the fifth conductive layer in the first direction, a sixth memory cell being formed between the sixth conductive layer and the first semiconductor column;

a sequencer configured to perform a first operation on the first memory cell in response to a command sent from an exterior of the memory device, the first operation including operations carried out during a first period and during a second period after the first period, wherein, during the first period of the first operation:
a first voltage is applied to the first conductive layer,
a second voltage is applied to the second conductive layer,
a third voltage is applied to the third conductive layer,
a fourth voltage is applied to the fourth conductive layer,
a fifth voltage is applied to the fifth conductive layer and
a sixth voltage is applied to the sixth conductive layer, wherein, during the second period of the first operation:
a seventh voltage is applied to the first conductive layer,
an eighth voltage is applied to the second conductive layer,
a ninth voltage is applied to the third conductive layer,
a tenth voltage is applied to the fourth conductive layer,
an eleventh voltage is applied to the fifth conductive layer and
a twelfth voltage is applied to the sixth conductive layer, and wherein
the eleventh voltage is substantially the same as the fifth voltage
the seventh voltage is lower than the first voltage, and the eighth voltage is lower than the second voltage and is lower than the seventh voltage,
the ninth voltage is larger than the third voltage, and
the eleventh voltage is substantially the same as the fifth voltage.

2. The memory device according to claim 1, wherein the first operation is a read operation performed on the first memory cell, and
the ninth voltage is higher than the eleventh voltage.

3. The memory device according to claim 2, wherein during the second period of the first operation, a positive voltage is applied to the one of the bit lines,
the eighth, tenth, and twelfth voltages are each negative voltages.

4. The memory device according to claim 2, wherein during the second period of the first operation, a positive voltage is applied to the one of the bit lines,
the eighth and twelfth voltages are negative voltages, and the tenth voltage is a positive voltage.

5. The memory device according to claim 1, wherein the first semiconductor column has a first pillar portion that faces the first, third and fifth conductive layers and extends in the third direction, and a second pillar portion that faces the second, fourth and sixth conductive layers and extends in the third direction, the first and second pillar portions being electrically isolated from each other in the first direction.

6. The memory device according to claim 5, further comprising:
a first transistor that controls an electrical connection and disconnection between the one of the bit lines and the first pillar portion; and
a second transistor that controls an electrical connection and disconnection between the one of the bit lines and the second pillar portion, wherein
during the second period of the first operation in which a positive voltage is applied to the one of the bit lines, the first transistor is turned on and the second transistor is turned off.

7. The memory device according to claim 1, further comprising:
a second semiconductor column extending in the third direction between the substrate and the one of the bit lines, wherein
the first, third and fifth conductive layers extend parallel to a surface of the substrate,
the first, third and fifth conductive layers face the first side of the first semiconductor in the first direction and face a second side of the second semiconductor column in the first direction, and
seventh, eighth and ninth memory cells are formed between the first, third and fifth conductive layers and the second semiconductor column, respectively.

8. The memory device according to claim 7, further comprising:
seventh, eighth and ninth conductive layers extending parallel to the surface of the substrate, wherein
the seventh, eighth and ninth conductive layers face a first side of the second semiconductor column, opposite to the first, third and fifth conductive layers in the first direction, respectively, and
tenth, eleventh and twelfth memory cells are formed between the seventh, eighth and ninth conductive layers and the second semiconductor column, respectively.

9. The memory device according to claim 8, wherein during the second period of the first operation in which a positive voltage is applied to the one of the bit lines, negative voltages are applied to the seventh and ninth conductive layers.

10. The memory device according to claim 9, wherein during the second period of the first operation in which a positive voltage is applied to the one of the bit lines, a positive voltage less than the eleventh voltage is applied to the eighth conductive layer.

11. A memory device comprising:
a substrate;
a plurality of bit lines above the substrate extending in a first direction and being separated from one another in a second direction, the second direction crossing the first direction;

a first semiconductor column extending in a third direction between the substrate and one of the bit lines, the third direction crossing the first direction and the second direction;
a first conductive layer on a first side of the semiconductor column in the first direction, a first memory cell being formed between the first conductive layer and the first semiconductor column;
a second conductive layer on a second side of the first semiconductor column, opposite to the first conductive layer in the first direction, a second memory cell being formed between the second conductive layer and the first semiconductor column;
a third conductive layer below the first conductive layer and on the first side of the first semiconductor column, wherein no conductive layer is between the first and third conductive layers in the third direction, a third memory cell being formed between the third conductive layer and the first semiconductor column;
a fourth conductive layer on the second side of the first semiconductor column, opposite to the third conductive layer in the first direction, a fourth memory cell being formed between the fourth conductive layer and the first semiconductor column;
a fifth conductive layer below the third conductive layer and on the first side of the first semiconductor column, a fifth memory cell being formed between the fifth conductive layer and the first semiconductor column;
a sixth conductive layer below the fourth conductive layer and on the second side of the first semiconductor column, opposite to the fifth conductive layer in the first direction, a sixth memory cell being formed between the sixth conductive layer and the first semiconductor column; and
a sequencer configured to perform a first operation on the first memory cell in response to a command sent from an exterior of the memory device, the first operation including operations carried out during a first period and during a second period after the first period,
wherein, during the first period of the first operation,
a first voltage is applied to the first conductive layer,
a second voltage is applied to the second conductive layer,
a third voltage is applied to the third conductive layer,
a fourth voltage is applied to the fourth conductive layer,
a fifth voltage is applied to the fifth conductive layer, and
a sixth voltage is applied to the sixth conductive layer,
wherein, during the second period of the first operation:
a seventh voltage is applied to the first conductive layer,
an eighth voltage is applied to the second conductive layer,
a ninth voltage is applied to the third conductive layer,
a tenth voltage is applied to the fourth conductive layer,
an eleventh voltage is applied to the fifth conductive layer and
a twelfth voltage is applied to the sixth conductive layer, and
wherein
the eleventh voltage is substantially the same as the fifth voltage
the seventh voltage is lower than the first voltage, and
the eighth voltage is lower than the second voltage and is lower than the seventh voltage,
the ninth voltage is larger than the third voltage, and the eleventh voltage is substantially the same as the fifth voltage.

12. The memory device according to claim 11, wherein the first operation is a read operation performed on the first memory cell, and
the ninth voltage is higher than the eleventh voltage.

13. The memory device according to claim 12, wherein during the second period of the first operation, a positive voltage is applied to the one of the bit lines,
the eighth, tenth, and twelfth voltages are each negative voltages.

14. The memory device according to claim 12, wherein during the second period of the first operation, a positive voltage is applied to the one of the bit lines,
the eighth and twelfth voltages are negative voltages, and the tenth voltage is a positive voltage.

15. The memory device according to claim 11, wherein the first semiconductor column has a first pillar portion that faces the first, third and fifth conductive layers and extends in the third direction, and a second pillar portion that faces the second, fourth and sixth conductive layers and extends in the third direction, the first and second pillar portions being electrically isolated from each other in the first direction.

16. The memory device according to claim 15, further comprising:
a first transistor that controls an electrical connection and disconnection between the one of the bit lines and the first pillar portion; and
a second transistor that controls an electrical connection and disconnection between the one of the bit lines and the second pillar portion, wherein
during the second period of the first operation in which a positive voltage is applied to the one of the bit lines, the first transistor is turned on and the second transistor is turned off.

17. The memory device according to claim 11, further comprising:
a second semiconductor column extending in the third direction between the substrate and the one of the bit lines, wherein
the first, third and fifth conductive layers extend parallel to a surface of the substrate, and
the first, third and fifth conductive layers face the first side of the first semiconductor in the first direction and face a second side of the second semiconductor column in the first direction,
seventh, eighth and ninth memory cells are formed between the first, third and fifth conductive layers and the second semiconductor column, respectively.

18. The memory device according to claim 17, further comprising:
seventh, eighth and ninth conductive layers, wherein
the seventh, eighth and ninth conductive layers extending parallel to the surface of the substrate, wherein
the seventh, eighth and ninth conductive layers face a first side of the second semiconductor column, opposite to the first, third and fifth conductive layers in the first direction, respectively, and
tenth, eleventh and twelfth memory cells are formed between the seventh, eighth and ninth conductive layers and the second semiconductor column, respectively.

19. The memory device according to claim 18, wherein during the second period of the first operation in which a positive voltage is applied to the one of the bit lines, negative voltages are applied to the seventh and ninth conductive layers.

20. The memory device according to claim 19, wherein during the second period of the first operation in which a positive voltage is applied to the one of the bit lines, a positive voltage less than the fifth voltage is applied to the eighth conductive layer.

* * * * *